(12) United States Patent
Grems, III et al.

(10) Patent No.: US 9,177,270 B2
(45) Date of Patent: Nov. 3, 2015

(54) ENGINEERING REVIEW INFORMATION SYSTEM

(75) Inventors: Edward G. Grems, III, Vienna, VA (US); James E. Henze, Cocoa Beach, FL (US); Jonathan A. Bixby, Titusville, FL (US); Mark Roberts, Annapolis, MD (US); Thomas Mann, Bowie, MD (US)

(73) Assignee: A.I. SOLUTIONS, INC., Lanham, MD (US)

(*) Notice: Subject to any disclaimer, the term of this patent is extended or adjusted under 35 U.S.C. 154(b) by 1198 days.

(21) Appl. No.: 11/428,016

(22) Filed: Jun. 30, 2006

(65) Prior Publication Data

US 2008/0005122 A1    Jan. 3, 2008

(51) Int. Cl.
*G06F 17/30* (2006.01)
*G06Q 10/06* (2012.01)
*G06F 17/00* (2006.01)
*G06F 17/50* (2006.01)

(52) U.S. Cl.
CPC .............. *G06Q 10/06* (2013.01); *G06F 17/60* (2013.01); *G06F 17/50* (2013.01); *G06Q 10/06311* (2013.01); *G06Q 10/063118* (2013.01)

(58) Field of Classification Search
CPC ......... G06F 17/60; G06F 17/50; G06Q 10/06; G06Q 10/063118; G06Q 10/06311
USPC ........ 707/1, 4, 10, 100, 104.1, 102, 200, 792, 707/796, 802, 803; 700/95, 97
See application file for complete search history.

(56) References Cited

U.S. PATENT DOCUMENTS

| | | | |
|---|---|---|---|
| 6,633,878 B1* | 10/2003 | Underwood | 707/999.001 |
| 6,928,396 B2* | 8/2005 | Thackston | 703/1 |
| 7,051,036 B2* | 5/2006 | Rosnow et al. | 707/102 |
| 7,146,350 B2* | 12/2006 | Holland et al. | 706/47 |
| 7,337,124 B2* | 2/2008 | Corral | 705/9 |
| 7,337,191 B2* | 2/2008 | Haeberle et al. | 707/999.003 |
| 7,599,964 B1* | 10/2009 | Bozek et al. | 707/999.104 |
| 2002/0169734 A1* | 11/2002 | Giel et al. | 706/45 |
| 2003/0023597 A1* | 1/2003 | Ha et al. | 707/10 |
| 2003/0126105 A1* | 7/2003 | Kahler et al. | 707/1 |
| 2004/0015556 A1* | 1/2004 | Chopra | 709/206 |
| 2004/0128188 A1* | 7/2004 | Leither et al. | 705/11 |
| 2004/0205129 A1* | 10/2004 | Bongiorni et al. | 709/204 |
| 2006/0161879 A1* | 7/2006 | Lubrecht et al. | 717/101 |

* cited by examiner

*Primary Examiner* — Jay Morrison
*Assistant Examiner* — Dangelino Gortayo
(74) *Attorney, Agent, or Firm* — Staas & Halsey LLP

(57) ABSTRACT

A disciplinal engineering review computer information system and method by defining a database of disciplinal engineering review process entities for an enterprise engineering program, opening a computer supported engineering item based upon the defined disciplinal engineering review process entities, managing a review of the opened engineering item according to the defined disciplinal engineering review process entities, and closing the opened engineering item according to the opened engineering item review.

11 Claims, 20 Drawing Sheets

ERBIS
Engineering Review Board Information System

Data Entry   Query   Documents   Contact Us   Log Off

Engineering Review Summary

NOTE: User must save data before leaving this page.

ERS Number:        None Assigned
ERS Title:         [                    ]
ERS Site:          [None          ▼]
Origination Date:  5/24/2004
Referring Action Item: [None       ▼]
ERB Required:      ☐
ERS Coordinator:   [None          ▼]

Engineering System Categories:
- ☐ Category 1          ☐ Category 10         ☐ Category 11
- ☐ Category 12         ☐ Category 13         ☐ Category 14
- ☐ Category 15         ☐ Category 2          ☐ Category 3
- ☐ Category 4          ☐ Category 5          ☐ Category 6
- ☐ Category 7          ☐ Category 8          ☐ Category 9

Vehicles:
- ☐ Vehicle 1           ☐ Vehicle 10          ☐ Vehicle 11
- ☐ Vehicle 12          ☐ Vehicle 13          ☐ Vehicle 14
- ☐ Vehicle 15          ☐ Vehicle 2           ☐ Vehicle 3
- ☐ Vehicle 4           ☐ Vehicle 5           ☐ Vehicle 6
- ☐ Vehicle 7           ☐ Vehicle 8           ☐ Vehicle 9

Missions/Projects:
- ☐ Mission 1           ☐ Mission 10          ☐ Mission 11
- ☐ Mission 12          ☐ Mission 13          ☐ Mission 14
- ☐ Mission 15          ☐ Mission 2           ☐ Mission 3
- ☐ Mission 4           ☐ Mission 5           ☐ Mission 6
- ☐ Mission 7           ☐ Mission 8           ☐ Mission 9

Close Missions/Projects:

Subsystems:
- ☐ Subsystem 1         ☐ Subsystem 10        ☐ Subsystem 11
- ☐ Subsystem 12        ☐ Subsystem 13        ☐ Subsystem 14
- ☐ Subsystem 15        ☐ Subsystem 2         ☐ Subsystem 3
- ☐ Subsystem 4         ☐ Subsystem 5         ☐ Subsystem 6
- ☐ Subsystem 7         ☐ Subsystem 8         ☐ Subsystem 9

Types:
- ☐ Mission Unique      ☐ Core Vehicle        ☐ Certification

Keywords:
[None ▼] [None ▼] [None ▼] [None ▼] [None ▼]

ERS Summary

☐ ERS: ERS-06-04 - Test ERS Title
  Status: Open

414 — ERB Results & Recommendations:

302a — ☐ ERB-06-04 - Closed - Test ERB 1
Action Item
AI-06-04-1 - Closed - Action item text. Action item text. Action item text. Action item text. Action item text. Action item text. Action item text. Action item text. Action item text. Action ite....
AI-06-04-2 - Closed - Action item text. Action item text. Action item text. Action item text. Action item text. Action item text.
414a — Recommendation and Rationale:
RR-06-04-1 - Test Recommendation 1
RR-06-04-2 - Test Recommendation 2

302n — ☐ ERB-06-04-1 - Drafted - Test ERB 2
Action Item
AI-06-04-3 - Closed - Action item text. Action item text. Action item text. Action item text. Action item text. Action item text. Action item text.
414n — Recommendation and Rationale:
RR-06-04-3 - Test Recommendation 3

[Generate Attachment] [Generate ERB]

ERS Attachments: — 318    1220

1. Test Attachment 1 - Attachment 1 description. Attachment 1 description. Attachment 1 description. Attachment 1 description.
2. Test Attachment 2 - Attachment 2 description. Attachment 2 description. Attachment 2 description. Attachment 2 description.
3. Test Attachment 3 - Attachment 3 description. Attachment 3 description. Attachment 3 description. Attachment 3 description.

FIG. 12C

ENGINEERING REVIEW INFORMATION SYSTEM

GOVERNMENT CONTRACT CLAUSE

This invention was made with US Government support under prime contract No. NAS10-02026 awarded by the National Aeronautics and Space Administration (NASA). The United States Government may have certain rights in this invention.

BACKGROUND OF THE INVENTION

1. Field of the Invention

The present invention relates to a computer system to support the engineering review process in any engineering field.

2. Description of the Related Art

Managing the people, data and activities associated with the Engineering Review Process (ERP) for an enterprise program presents challenges to the people involved. Conventionally, an enterprise managed the ERP manually using spreadsheets to identify and input a problem and assign personnel to the problem. Cross-referencing data concerning identical problems and causes in different systems or different problems within a single system or both was also done manually.

SUMMARY OF THE INVENTION

An apparatus and a method to disciplinarily support the Engineering Review Process (ERP) across multiple engineering systems for an enterprise program.

Additional aspects and advantages of the invention will be set forth in part in the description which follows and, in part, will be obvious from the description, or may be learned by practice of the invention.

To provide a disciplinal engineering review computer information system by defining a database of disciplinal engineering review process entities for an enterprise engineering program, opening a computer supported engineering item based upon the defined disciplinal engineering review process entities, managing a review of the opened engineering item according to the defined disciplinal engineering review process entities, closing the opened engineering item according to the opened engineering item review and the archiving and cross-referencing of all engineering items for use across the enterprise program.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 7A-7D are computer user interface display screen images to complete an opened engineering item, according to an embodiment of the present invention, FIGS. 8A-8D are computer user interface display screen images to support a review board meeting/discussion, according to an embodiment of the present invention, FIGS. 12A-12C are computer user interface display screen images to query the engineering review process knowledge base, according to an embodiment of the present invention.

DETAILED DESCRIPTION OF THE PREFERRED EMBODIMENTS

Figure 1:
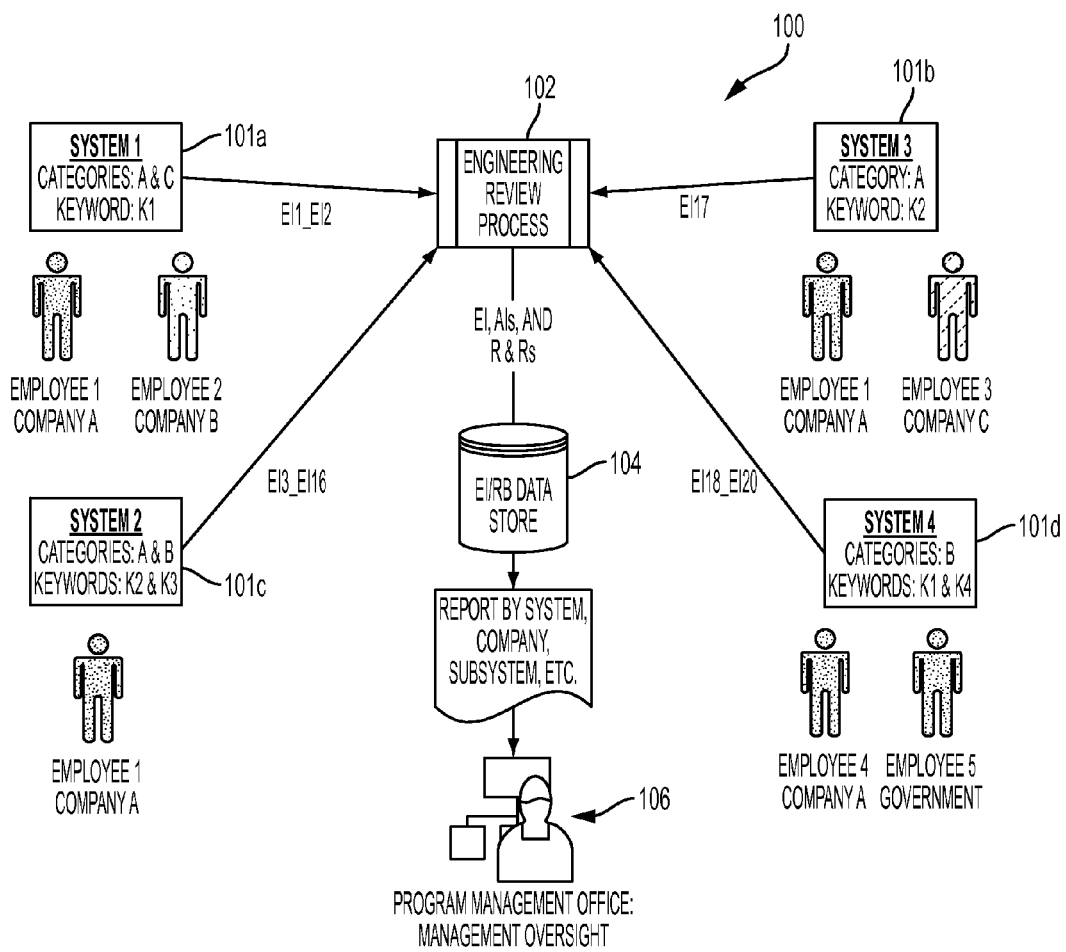
FIG. 1 is a diagram of an overall engineering review process across multiple systems and enterprise programs, according to an embodiment of the present invention.

Reference will now be made in detail to the present embodiments of the present invention, examples of which are illustrated in the accompanying drawings, wherein like reference numerals refer to the like elements throughout. The embodiments are described below to explain the present invention by referring to the figures.

The Engineering Review Process (ERP) at an enterprise, such as a government agency can involve the coordination of Engineering Review Board (ERB) members, and requires complete and careful documentation of engineering issues, in progress and resolved. Essential to any engineering review process is the ability of a user community to capture, store and retrieve information. According to the embodiments, the type of information generated throughout the ERP is used build the database of information that enables metrics to be established and lessons learned to be tracked. For example, a government agency's engineering community needs enabling tools to make the ERP easier to administer so that enterprise program planners could focus on the unique technical challenges of each enterprise program. ERBIS documents, manages and facilitates the communication that is critical to the ERP. ERBIS allows the initiating engineer to log in and originate/open an Engineering Item (EI), also referred to as an Engineering Review Summary (ERS), as defined in more detail below. ERBIS automatically assigns an EI number and provides an automated notification process for the appropriate reviewers. The automatic tracking system allows engineers to view the progress on action items, open issues, and final resolution in connection with an EI. The built-in, mandatory approval process enables the ERP members to better manage the resolution process.

ERBIS provides an efficient way for an enterprise to enforce the ERP. This web-based system is available to all approved users from any location. The ERBIS knowledge database is searchable by defined disciplinal engineering review process entities, for example, in the case of a launch program, by launch vehicle, mission, part number, system or vendor. ERBIS supports metrics that facilitates trending and tracking of issues used in risk evaluation. ERBIS allows knowledge management, control of processes, and tracking of activities that prevent "memory loss" for the enterprise program. ERBIS helps reduce risk through the use of a repeatable process, and lets enterprise program planners focus on the enterprise program and not on the ERP.

The Engineering Review Information System (according to typical embodiments referred to as the Engineering Review Board Information System (ERBIS)) is an information technology (IT) solution that facilitates the management of a set of complex engineering systems under an engineering program. An enterprise engineering program is an enterprise that handles or manages multiple like systems. Although, the embodiments are not limited to an enterprise managing like systems, but ERBIS can be directed to an enterprise engineering program involving multiple different systems. To this end, ERBIS provides the following examples of functionality.

1. The creation of an Engineering Item (EI) in which a particular set of engineering data (e.g., test results) and corresponding evidence (e.g., hardware parts, photographs, etc.) associated with an engineering issue on a given engineering system are stored and classified.

2. A mechanism by which a team of engineers, for example, called the Engineering Team (ET), can publish a Description, a Resolution, and a Dispensation of an EI.

3. A mechanism by which a Review Board (RB) can:
   i. publish RB Recommendations and Rationales (R&Rs) to the Engineering Team
   ii. assign Action Items (AIs) to the Engineering Team
   iii. monitor progress in the investigation of a given EI, and
   iv. monitor completion of the associated (AIs).
   v. A method for assigning each user Roles and Responsibilities.
   vi. A formal sign-off process in which an EI can be closed only when the Engineering Team and the Review Board have reached a consensus.

6. A permanent archive of all EIs and their associated data and evidence.

7. A structured classification method for categorizing an EI.

8. A set of keywords associated with an EI.

9. A search method based on the classification.

10. A cross-referencing method by which all EIs that meet a certain set of search criteria (keywords and/or classification) can be queried and reported.

11. Easy, real-time, dynamic, customizable keywords and classification methods based on the particular terminology used on a given engineering enterprise program.

12. Universal access at any location that has access to the world-wide-web.

The herein described and claimed embodiments are not limited to the above example functionalities and others may be realized.

The present invention provides an overall platform to cover the engineering review process in many different engineering fields, such as (without limitation) a space launch vehicle program by a government agency. For example, applications to activities as diverse as building an automobile, constructing a power plant, or the like are accommodated by ERBIS with simple cosmetic changes to the user interface display screens presented to the user. The reason for this broad applicability is the fact that the ERBIS process provides and implements an abstract approach based on a set of best practices common to all engineering disciplines. Most notably amongst these are (1) the need for careful documentation of the investigations into the issue in question, (2) the need for external review of the results using a formal process, and (3) the acquisition of institutional knowledge for use across all applicable systems. The first two concepts are local in scope, being confined to the investigation of the issue in question. The third of these concepts, the acquisition of knowledge, requires a synthesis of data from a variety of sources and the recognition of any patterns that emerge.

The following definitions aid in understanding the embodiment(s):

The term "Engineering Item" (EI) refers to an official ERBIS record of an "issue." An "issue" is defined as the results of an inspection, a test, a review, or similar activity, and is most often identified with a discrepancy and/or observation in the behavior of a thing, hardware- or software-component from what is expected or required. Examples of an issue range from cracks in a metal part, underperformance of a piece of electronics, a system crash in a piece of software, and so on.

The term "Enterprise Engineering Program" or "Enterprise Program" refers to an enterprise project that deals with multiple systems, each comprised of multiple subsystems and multiple parts, all grouped together by a common purpose. For example, a government agency's Example Launch Vehicle program, where the agency is an enterprise. The Example Launch Vehicle program can, for example, cover a plurality of different manufacturers with a plurality of different configurations of a plurality of different classes of launch vehicles. Considering that each launch vehicle can have approximately 10 major subsystems and each of these can be further divided into sub-subsystems, components, and parts, it is clear that the degree of complexity is very large and failure in any part, component, or subsystem can result in the loss of the vehicle and its payload. Thus it is critical that potential "issues" be recognized, investigated, and, as the case may be, subjected to review or oversight (internal and/or external) before launch. In addition, it is critical for the program management office (PMO) of the enterprise to be able to determine whether an issue found with one vehicle could be applicable to other engineering systems, for example, to other similar and/or different vehicles. For example, if the launch vehicles or rockets of manufacturer A and manufacturer B share a common subsystem, then an issue with a particular subsystem on a manufacturer A rocket may also affect the manufacturer B rocket. ERBIS facilitates the tracking of issues by a variety of classifications depending on the engineering program, such as in a launch vehicle program, a vehicle (e.g., rocket in this example), a manufacturer, or a mission type (low-Earth orbit) for the vehicle, or any combinations thereof.

ERBIS tracks and controls all critical Engineering Items (EIs), associated with an engineering program, by imposing a rigorous disciplinal process used in conjunction with an information technology (IT) solution. Once an issue is identified, ERBIS defines best practices by accommodating one or more (in any order) of:

1. a clear and concise Description of the EI
2. the careful collection of supporting evidence
3. a careful and rigorous disciplinal process by which an EI is investigated
4. external review of the Resolution and Disposition of an EI, and
5. complete documentation of the findings in a fashion that permits use across the enterprise program.

To enable programmatic (as in enterprise engineering program) use, each EI must be classified and cross-referenced using a set of criteria. Generally, there are multiple ways of categorizing an EI based on such criteria as the type of system, the manufacturer, the type of subsystem, part numbers, etc. Additionally, each EI is assigned a set of keywords as additional classification criteria. For example, the program management office (PMO) of an engineering program can specify the EI categorization and/or keywords, which can be updated by the ERBIS system administrator.

The ERBIS embodiments can be implemented using computing hardware (computers) and/or software, such as standard web-based and relational database technologies to enable entering EIs, the monitoring of the formal process by which each EI is addressed, and an infrastructure by which all available EIs are archived, cross-referenced, and made available for reporting.

FIG. 1 is a diagram of an overall engineering review process addressed by ERBIS for management across multiple systems of an engineering program, according to an embodiment of the present invention. FIG. 1 illustrates a process of the present invention as applied to a hypothetical engineering program. In FIG. 1, the engineering program 100 comprises four systems 101a-d labeled as Systems 1 through 4. However, any number of systems can be involved. The systems are not restricted as to type. A category indicator and set of keywords (K) categorize each system. Several personnel are charged with testing, inspecting, or reviewing various aspects of the systems. As an example, consider the case of System 3. During testing, Employees 1 and 3 note an issue with a component and initiate an EI. The EI is subjected to a formal process (described in detail below) that involves review and sign-off of the EI by additional engineering staff, such as Employees 2 and 5 and also by a representative of a program management office (PMO) 106. Once the review is complete, the EI is archived and cross-referenced in the database 104 (EI/Review Board (RB) data store). The program management office (PMO) 106, which oversees the program, can monitor the progress of a specific EI or can get reports on all EIs associated with a given classification. For example, if the PMO 106 queries ERBIS for all systems classified as falling into category A, ERBIS will return information about systems 1, 2, and 3 and will provide access to EIs 1-17. Alternatively, the PMO 106 may want systems that have K1 as a keyword. ERBIS will then return EIs 1 & 2 and EIs 18-20 associated with System 1 and System 4, respectively. Of course, ERBIS will return no results for a query that asks for all data on systems that fall into category C with K3.

Figure 2A:
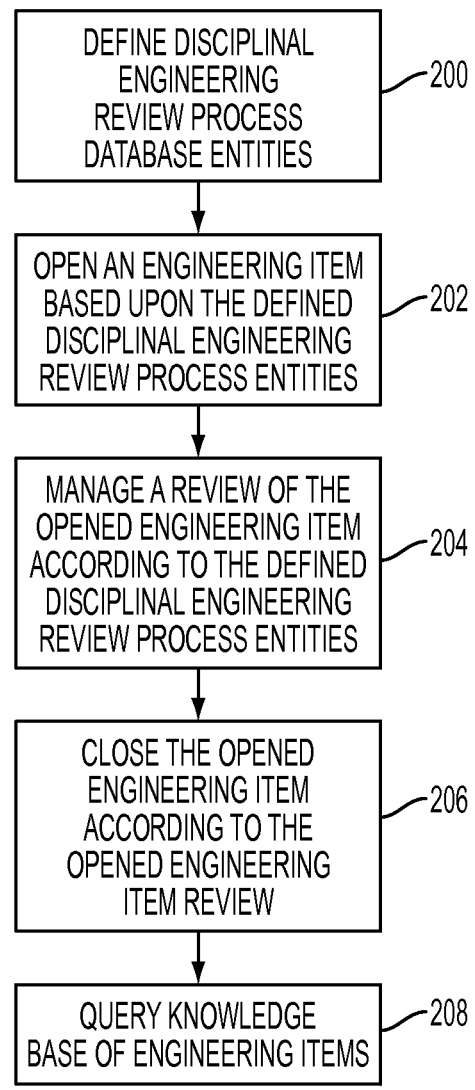
FIG. 2A is a flow chart of a disciplinal engineering review computer information system, according to an embodiment of the present invention.

FIG. 2A is a flow chart of a disciplinal engineering review computer information system, according to an embodiment of the present invention. A disciplinal engineering review computer information system is provided by, at operation 200, defining a database of disciplinal engineering review process entities for an enterprise engineering program, at operation 202, opening a computer supported engineering item based upon the defined disciplinal engineering review process entities, at operation 204, managing a review of the opened engineering item according to the defined disciplinal engineering review process entities, and, at operation 206, closing the opened engineering item according to the opened engineering item review. According to an aspect of the embodiment, a knowledge base of engineering items is creatable based upon opening, reviewing and closing of two or more engineering items through operations 202, 204 and 206, and at operation 208, the knowledge base is queried to support metrics of trending or pattern analysis, status reports, issue tracking, risk evaluation, historical reports, issue resolution, search, etc. According to an aspect of the embodiments, the operation 208 queries are based upon the defined disciplinal engineering review process entities.

Figure 2B:
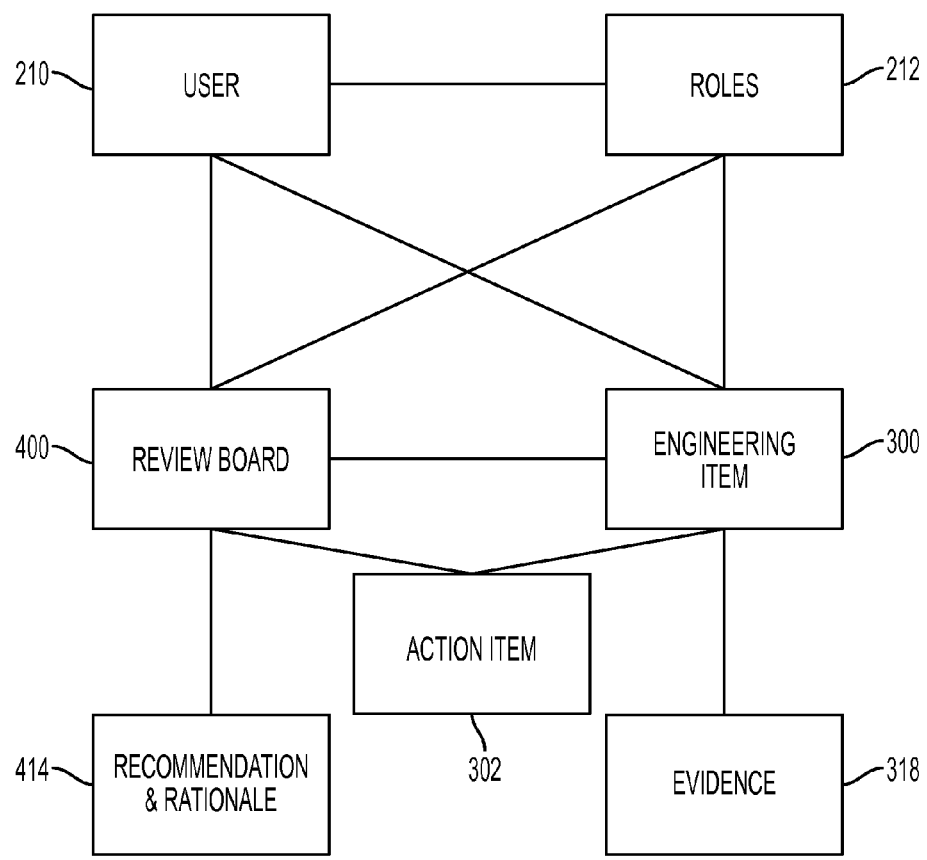
FIG. 2B is a basic entity-relationship diagram for relationships among disciplinal engineering review process database entities, according to an embodiment of the present invention.
Figure 3:
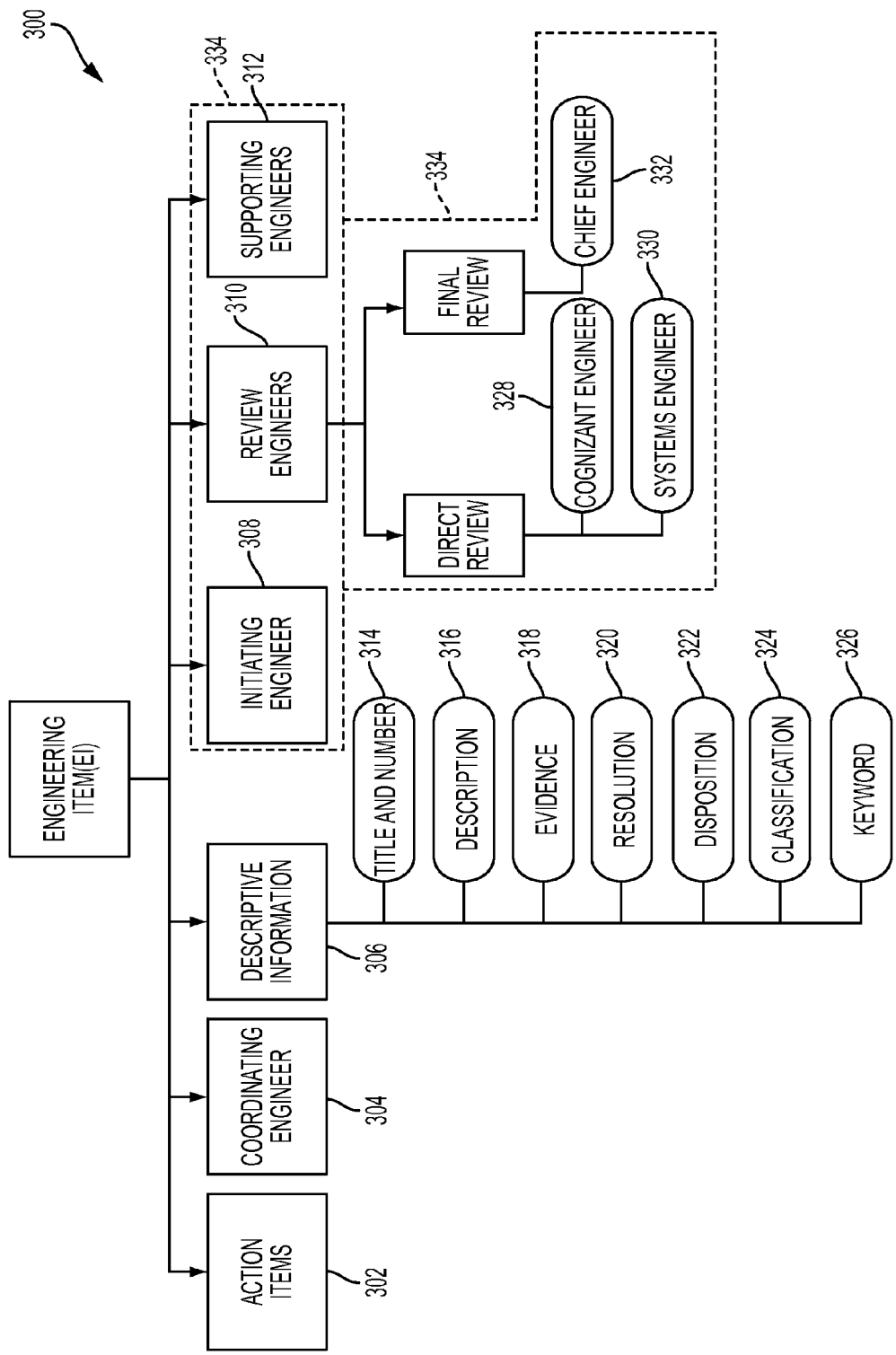
FIG. 3 is a schematic of the Engineering Review Board Information System (ERBIS) representation of an Engineering Item (EI), according to an embodiment of the present invention.

FIG. 2B is a basic entity-relationship diagram for relationships among disciplinal engineering review process database entities, according to an embodiment of the present invention. Referring back to FIG. 2A, at operation 200, the disciplinal engineering review process entities shown in FIG. 2B are defined, which for an enterprise program comprise (1) user(s) 210; (2) roles of the users 212; (3) review board 400; (4) engineering item (EI) 300; (5) action item (AI) 302; and (6) recommendation and rationale (R&R) 414; and (7) evidence 318. The ERBIS representation of each defined entity will be described. FIG. 3 is a schematic of the ERBIS representation of an Engineering Item (EI), according to an embodiment of the present invention. In FIG. 3, at the highest level, typically according to the embodiments, an EI is described by six attributes, two of which have lower levels of details. Table 1 defines the six attributes. In FIG. 3, an EI 300 comprises action item(s) 302, a coordinating engineer 304, descriptive information 306, initiating engineer 308, review engineers 310 and supporting engineers 312. Further, the descriptive information 306 can comprise title and number 314, description 316, evidence 318, resolution 320, disposition 322, classification(s) or category(ies) 324, and keyword(s) 326. Further, the review engineers 310 can comprise cognizant engineer 328 and systems engineer 330 having a direct review function and a chief engineer 332 having a final review of the EI 300 function. Collectively the initiating engineer 308 and the review and supporting engineers 310, 312 comprise an Engineering Team 334. According to an aspect of the invention, the Engineering Team 334 can be one or a plurality of engineers to support, including perform (as the case may be), in the investigation and closure of an EI 300. According to an aspect of the invention, the coordinating engineer 304 is optional. Thus, an EI 300 is composed of at least descriptive information 306, including description 316, resolution 320, disposition 322, classification 324 and/or keyword 326, and an Engineering Team 334 with final review authority role.

Table 1 is an ERBIS representation of an EI, according to an embodiment of the present invention. Table 1 defines attributes of an EI.

TABLE 1

ERBIS representation of an EI

| Attribute | Definition |
| --- | --- |
| Action Item(s) | A list of action item(s) (AIs) that come from all the review boards associated with an EI |
| Coordinating Engineer | The engineer charged with monitoring the status of an EI and with closing out the R&Rs and AIs associated with the EI |
| Descriptive Information | The collection of data that assists in the tracking, archival, and cross-referencing of an EI. The collection includes:<br>Title and tracking number<br>Description of the EI, for example, in engineering terms as text<br>Evidence supporting the EI investigation, assessment, and review process of the EI<br>Resolution of the EI to state the root cause of the EI<br>Disposition of the EI stating the method employed in resolving the EI and the success of the resolution<br>Classification data describing a variety of criteria for cross-referencing - enterprise engineering program or application specific<br>Keywords for further cross-referencing - enterprise engineering program or application specific |

TABLE 1-continued

ERBIS representation of an EI

| Attribute | Definition |
| --- | --- |
| Initiating Engineer | Engineer charged with opening an EI. |
| Review Engineers | Engineers charged with the review of the EI. The two main classes of review engineers are the direct review and the final review. The direct review class is composed of the Cognizant Engineer, usually the supervisor of the Initiating Engineer, and the Systems Engineer, usually responsible for the system associated with the EI. The final review is composed of the Chief Engineer. Typically in the embodiments, the Chief Engineer is a representative of the Program Management Office. |
| Supporting Engineers | Additional engineers who support in the investigation and closure of an EI. |

Figure 4:
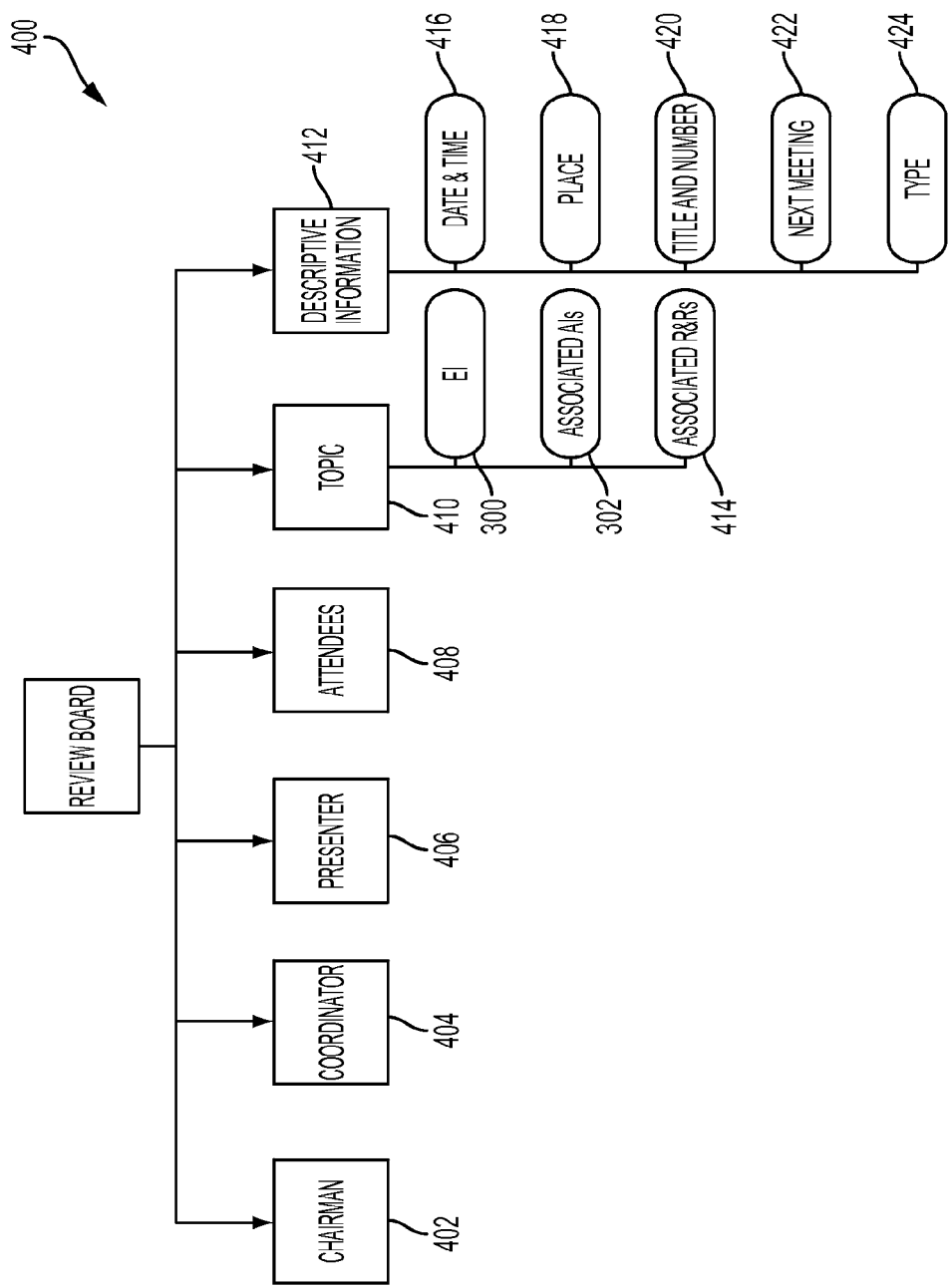
FIG. 4 is a schematic of the ERBIS representation of a Review Board (RB), according to an embodiment of the present invention.

FIG. 4 is a schematic of the ERBIS representation of a Review Board (RB), according to an embodiment of the present invention. In FIG. 4, an RB 400, for example, comprises a chairman 402, a coordinator 404, a presenter 406, one or more attendees 408, a topic 410 and descriptive information 412. The topic of an RB 400 is an EI 300 and the EI's 300 associated Action Items (AIs) 302 (see Table 1) and Recommendations & Rationales (R&Rs) 414. The R&Rs comprise the consultations and advice the board 400 delivers on an EI 300. The descriptive information 412 is a collection of data that assists in the tracking, archival, and cross-referencing of an EI 300, such as (without limitation) date and time 416, place 418, RB identification information 420, such as title and number, next meeting information 422, and type of RB 424.

According to an aspect of the invention, the user and user role composition of the RB is not limited to the FIG. 4 configuration and any Review Board user composition of one or more users with appropriate role(s) according to application design who are authorized to manage, including review and dispose, of an EI 300 can be provided.

Table 2 is an ERBIS representation of an example RB 400 defining six RB attributes, according to embodiment of the present invention.

TABLE 2

ERBIS representation of an RB

| Attribute | Definition |
| --- | --- |
| Chairman | Project management office representative charged with running the RB and giving final say. |
| Coordinator | Person charged with facilitating the convening and execution of an RB. |
| Presenter | The engineer charged with presenting the EI to the RB. |
| Attendees | Engineers and/or Reviewers who attend the RB |
| Topic | The topic of an RB is an EI and its associated AIs (see Table 1) and Recommendations & Rationales (R&Rs). The latter comprises the consultations and advice the board delivers on an EI. |
| Descriptive Information | The collection of data that assists in the tracking, archival, and cross-referencing of an EI. The collection, for example, includes Date and Time Place Title and tracking number Next meeting time if meeting is adjourned before completion Type of RB - enterprise engineering program or application specific |

Table 3 is an ERBIS representation of an example AI 302 defining attributes of the example AI 302, according to an embodiment of the present invention. An action item 302 is any required action given by the RB 400 to the Engineering Team 334 (see FIG. 3) associated with an EI 300 (for example, Initiating Engineer 308, Cognizant Engineer 328, Systems Engineer 330, and Supporting Engineers 312). For example, an action item can be to locate a person for an RB 400 meeting, perform a task to review a result thereof, etc. According to an aspect of the embodiments, the RB 400 assigns AIs 302 to EI investigative personnel, such as the Engineering Team 334, to investigate for closure of an EI 300. According to an aspect of the embodiments, the AI 302 is not limited to Table 3 and any AI 302 according to application design can be provided that identifies an action or task assignable by the RB 400 to personnel to manage, including perform, and the action's status, including due date(s) and open/close state, in support of investigation and closure of an associated EI 300. According to an aspect of the embodiments, the RB 400 can query knowledge base of EIs 300 to provide AIs 302. According to an aspect of the embodiments, AIs 302 can be assigned to anyone the RB 400 wants, not necessarily the current Engineering Team 334, although once an AI 302 is assigned, the actionee becomes a member of the Engineering Team 334.

TABLE 3

ERBIS Representation of an Action Item

| Attribute | Definition |
| --- | --- |
| Action Item Number | An application-generated ID for the action. Its format can be as follows: AI-YY-NNN-SSS Where: AI - is a constant YY-NNN - from the owning or associated EI SSS - is a sequence number |
| Action Due Date | Date the action is due |
| Date Action Closed | Date the action is closed. This field can be automatically completed once the AI is marked closed. |
| Primary Actionee | Name of the person responsible for this action or for entering the action information into ERBIS, if someone else is responsible for the action (see below). |
| Secondary Actionee | Name of the person responsible for this action. Used only when the person responsible does not have authority to use the ERBIS system. |
| Action Item Title | Title description of the action |
| Action Item Text | Full text description of the action |
| Action Response | Full text description of the response to the Action Item |
| Status | Open or closed |

Table 4 is an ERBIS representation of an example R&R 414, according to an embodiment of the present invention. Table 4 defines example attributes of an R&R 414. A R&R 414 is advice given by the RB 400 to the Engineering Team 334 (e.g., Initiating Engineer, Cognizant Engineer, Systems Engineer, and Supporting Engineers) associated with an EI 300. According to an aspect of the embodiments, the R&R 414 is not limited to Table 4 and any R&R 414 according to application design can be provided that identifies an RB 400 advice to personnel associated with an EI 300 in support of investigation and closure of the EI 300. According to an aspect of the embodiments, the RB 400 can query knowledge base of EIs 300 to provide R&Rs 414.

TABLE 4

ERBIS Representation of a Recommendation and Rationale

| Attribute | Definition |
|---|---|
| Recommendation Number | An application-generated ID for the user. It can be generated by using the EI number's year and sequence corresponding to an EI identifier (e.g., title and tracking no. 314). Its format can be as follows: REC-YY-NNN-SS Where: REC - is a constant YY-NN - is from the owning EI SS - is a sequence number |

TABLE 4-continued

ERBIS Representation of a Recommendation and Rationale

| Attribute | Definition |
|---|---|
| Title | A brief description of the recommendation |
| Recommendation | Recommendation text |
| Rationale | Recommendation rationale |

Evidence 318 can be any type of information, be it physical (e.g. broken part), written (e.g., test results), or digital (e.g., a recording or digital picture) that documents or supports the descriptive information associated with an EI 300. ERBIS tracks the evidence 318 in the form of attachments to an EI 300; in the form of computer readable or accessible data, such as electronic files (documents, digital pictures, bar code, etc.) or specification of locations for actual items (e.g., mounting bracket hardware is found in cabinet B at work site Q).

A user 210 is defined to be anyone who has a user account in ERBIS. The only required attribute of a user 210 is any unique user identifier, such as a user name. However, the embodiments are not limited to only a user name attribute, and other user related attributes can be provided, such as (without limitation) user identification information, user authentication information, etc. According to an aspect of the embodiments, the users 210 can be any combination of users from the enterprise program or outside consultants, and the system can assign appropriate roles for limiting data access and/or manipulation. Although, in the case of outside consultants, such consultants would be assigned appropriate roles for data access and/or manipulation and authority to sign-in as a user 210.

User Roles 212 in ERBIS define the authority and control that an individual user 210 can have over an EI 300, RB 400, etc. Table 5 defines the various example roles a user may have, according to an embodiment of the present invention. However, the embodiments are not limited to the user roles 212 in Table 5 and other user roles can be provided. According to an aspect of the embodiments, typically the roles in ERBIS control what a user 210 can do and not what a user can see. If a user 210 has access to ERBIS, the user 210 can see any information in ERBIS (although the user 210 may not be able to change the information). ERBIS is intended to be open to all members of the enterprise, such that data dissemination is a significant functionality of ERBIS. However, the embodiments are not limited to such a configuration, and user roles can be assigned to also limit information access at any level, such as (without limitation) viewing, manipulation, transmission, confirmation/approval, etc.

TABLE 5

ERBIS Representation of Roles

| Attribute | Definition |
|---|---|
| Viewer | Read-only access to EI/RB data |
| Engineer | The Engineer role allows engineers to enter a new EI. Engineers are permitted to edit an existing EI and its attachments only if they have been identified as a participant of the RB review and evaluation process. This assignment is made by identifying an Engineer as an Initiating, Cognizant or Systems Engineer on the particular EI under review. |
| Coordinator | A user assigned to the Coordinator role may act as Coordinating Engineer for an EI, the Coordinator for and RB, or both. For example, only Coordinators may be assigned to close AIs, R&Rs, and RBs in ERBIS. |
| Chief Engineer | Responsible for ultimate signoff on an EI. |
| Administrator | Can change user roles, change category labels, add accounts, and perform system maintenance. |

Referring back to FIG. 2B, which is a basic entity-relationship diagram for relationships among disciplinal engineering review process database entities, a user 210 is a member of a review board 400, a user 210 has one or more roles 212 and a user is assigned to an engineering item 300. Further, a user 210 has a role 212 in the review board 400, and has a role in the investigation of an engineering item 300. A review board 400 reviews and/or evaluates an engineering item 300 and an engineering item 300 belongs to or is subject of a review board 400. Further, a review board 400 assigns action items 302 for an engineering item 300 and an engineering item 300 owns the action items 302. Further, an engineering item 300 has evidence related to the engineering item 300. Further, the review board 400 advises through recommendations and rationales (R&Rs) 414 concerning an engineering item 300. All the relationships in FIG. 4 are many-to-many except that in a typical embodiment each RB 400 is associated with only one engineering item (although the embodiment is not limited to such a configuration). In addition, not every engineering item 300 needs to have associated review boards 400, action items 302, or recommendations and rationales 414. However, if there are AIs 302 and R&R 414 associated with an EI 300 then there must be at least one corresponding RB 400, because a review board 400 generates or provides R&Rs 414 and submits action items 302.

Figure 5:
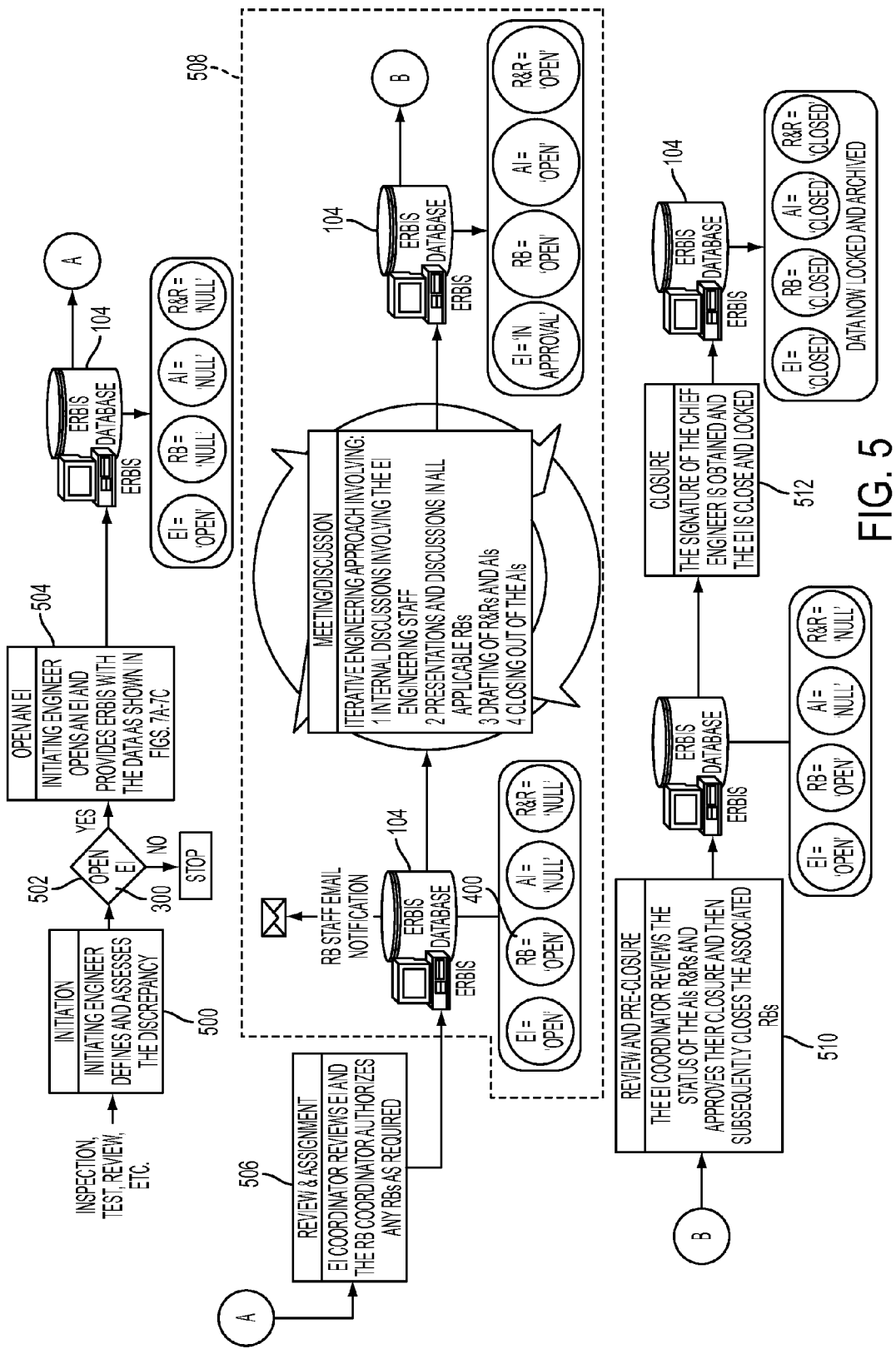
FIG. 5 is a flow chart of an engineering review process, according to an embodiment of the present invention.

FIG. 5 is a flow chart of an engineering review process, according to an embodiment of the present invention. In FIG. 5, the status of an EI 300, and associated RBs 400, AIs 302, and R&Rs 414 is denoted by the filled circles. Shown here are the cases when there is at least one RB 400, R&R 414, and AI 302. The status of any of these items is 'Null' if they do not exist. FIG. 5A deals with the ERBIS engineering process, which is defined as the process followed from the time an EI 300 is initiated until the time the EI 300 and its associated RBs 400, AIs 302, and R&Rs 414 are closed.

Figure 6:
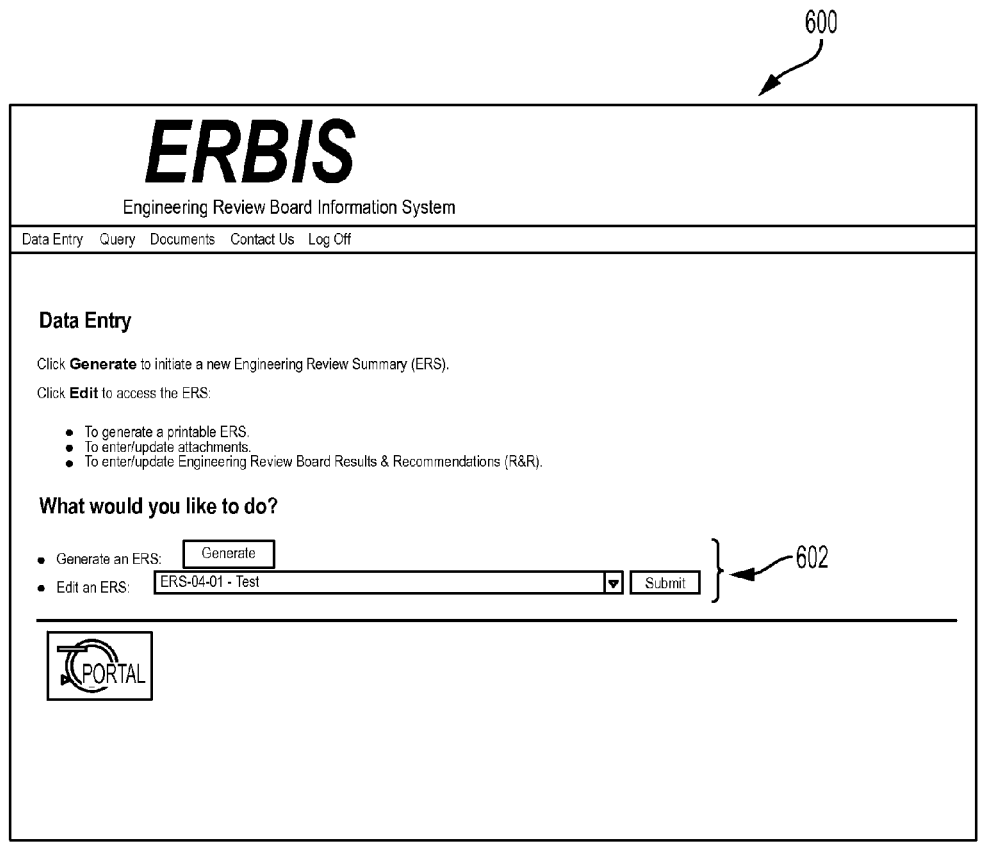
FIG. 6 is a computer user interface display screen image to originate/open an engineering item, according to an embodiment of the present invention.

In FIG. 5, at operation 500, a user 210, for example, an engineer, inspects, tests, reviews or performs related activity for an engineering system issue, for example, a manufacturer's launch vehicle as an engineering system of an Example Launch Vehicle program as an enterprise program. If, at operation 500, the user 210 identifies a discrepancy and/or observation, the user can define and assess the discrepancy and/or observation by opening an engineering item 300 and inputting EI information. FIG. 6 is a computer user interface display screen image 600 to open an EI 300, according to an embodiment of the present invention. In FIG. 6, a user 210 can manipulate a computer selectable displayed area 602 to generate and/or edit an EI 300. Therefore, if, at operation 502, the engineer 210 decides that the assessment results of the discrepancy warrant the opening of an EI 300, at operation 504, the engineer uses ERBIS where he or she enters some minimal set of the EI attributes. Typically according to the embodiments, at operation 504, the engineer 210 becomes the Initiating Engineer 308 who opens an EI 300 and inputs at least one of the Description 316, the Classifications 324, the Keywords 326, or any combinations thereof. According to an aspect of the embodiments, the initiating engineer 308 can also input the Cognizant 328 and Systems Engineer 330 at the time the EI is opened. At operation 504, ERBIS stores the opened EI 300 information in the ERBIS knowledge base 104.

Figure 7B:
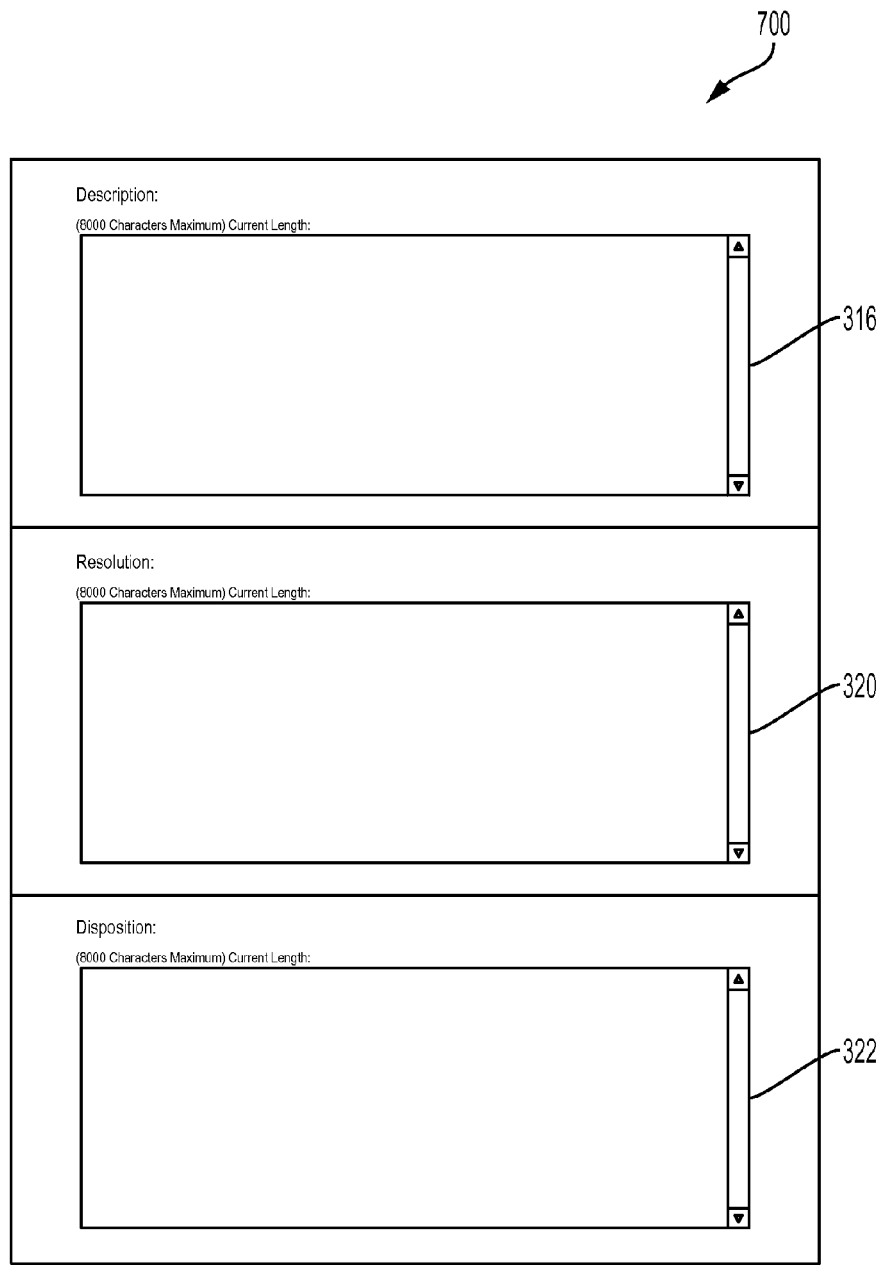
Figure 7C:
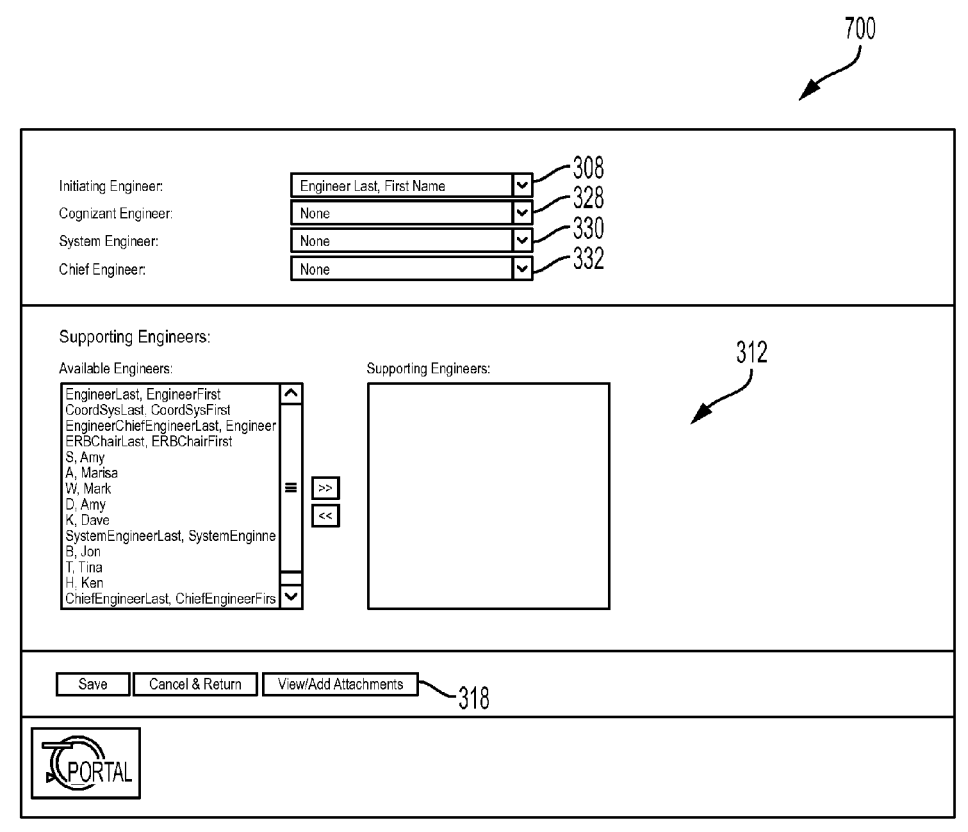

FIGS. 7A-7D are computer user interface display screen images to complete an opened engineering item, according to an embodiment of the present invention. In FIGS. 7A-7C, the user interface 700 provides a data input interface according to any known techniques, such as drop down menus, check boxes, input fields (text boxes), etc., for classifications 324 and keywords 326 of an EI 300, defining the vocabulary and environment of possible issues to be tracked in connection with an enterprise program. So, for example, in case of the Example Launch Vehicle enterprise program, classifications 324 are engineering system categories for the Example Launch Vehicle enterprise program, launch vehicles, missions/projects, subsystems that are in those launch vehicles, type information, and so on, associated with the enterprise program. The classifications 324 and keywords 326 are defined at operation 200 in FIG. 2A to discipline a user 210, such as an initiating engineer 308, in finding or observing, identifying and reporting an engineering system problem (issue). The classifications 324 and keywords 326 can support controlling as a management policy the level of scrutiny and confidence that goes into the necessary steps to close and open an issue or an open engineering item 300 against an engineering system problem. Further, the classifications 324 and keywords 326 provide relevancy of preadmissions of issues, searchability, cross-referencing other issues or trending, tracking, or the retrievability of old information to support ongoing activities in the enterprise program.

According to an aspect of the embodiments, the classifications 324 and/or keywords 326 relate or correlate an issue to accepted words in use by the enterprise program to standardize the descriptions 316 of issues input by the user(s) 210, for example, by the initiating engineer 308 in the description 316 of an EI 300 (FIG. 7B), creating a knowledge base of issues in connection with an enterprise program. Further, according to another aspect of the embodiments, the classifications 324 and/or keywords 326 can be real-time, dynamically set by users 210 having appropriate roles 212 to provide a real-time, dynamic standardization of the descriptions of issues 316.

According to an aspect of the embodiments, the classifications 324 and/or keywords 326 are established in consultation with enterprise program personnel, by studying the enterprise program, or based upon engineering or industry societies that define engineering systems, or any combinations thereof.

Figure 7D:

In FIG. 7B, the initiating engineer 308 inputs the issue description 316. Only the issue description 316 field needs to be completed to initiate or open an EI. The resolution 320 and the disposition 332 can be completed based upon the meeting/discussion stage involving the RB 400. According to an aspect of the embodiments, all three fields of description, resolution and disposition, must be completed and signed-off via the meeting/discussion stage 508 (described below) to close the opened EI. In FIG. 7C, the initiating engineer 308 identifies himself/herself as the engineering team 334, and can further identify (as the case may be) the engineering team 334 by inputting the cognizant engineer 328, system engineer 330, the chief engineer 332, or the supporting engineer(s) 332, or any combinations thereof. In FIG. 7C, evidence 318 can be associated with the EI 300, for example, as computer readable data attachments. An evidence attachment 318 is a representation of the evidence (either computer readable or a pointer to physical evidence) associated with an opened EI 300. In FIG. 7D the user interface 710 is a data input interface to input issue evidence 318 for an opened EI 300. For example evidence 318 that can be entered into ERBIS comprise attached or locatable computer data files 712, evidence description information 714, physical location information of identified evidence 716, or any combinations thereof. According to an aspect of the embodiments, the evidence 318 is searchable as part of providing an engineering review process knowledge base.

According to an aspect of the embodiments, the minimum data for opening an EI can be an EI identifier 314, initiating engineer 308 identification, an engineering system issue description 316 and some form of description categorization, such as classification 324 and/or keywords 326. In FIG. 7C, once the data has been entered to open an EI 300, the user 210 can choose to save, cancel or view attachments (FIG. 7C). Once the EI 300 has been initiated, the EI Coordinating Engineer can override the data. Typically according to the embodiments, a Coordinator role permits changing any data field (as described in more detail below).

In FIG. 5, at operation 506, an EI Coordinating Engineer 304 can review the opened EI 300. The EI Coordinating Engineer can be charged with monitoring the status of an EI 300, entering information/content of the RB 400 defined R&Rs 414, or the assigned AIs 302 associated with the EI 300. The EI Coordinator 304 can be charged with ensuring that the correct AIs 302 are assigned to the Engineering Team 334, according to the RB 400. Further, at operation 506 the RB Coordinator 404 is informed of the opened EI 300, and the RB Coordinator 404 determines whether any RBs 400 should be formed or called and authorizes any such RBs 400 as required. The determination of whether an RB 400 should be called can be application dependent or automatically determinable based upon provided criteria, or any combinations thereof. Thus, the next stage 508 is the RB 400 Meeting/Discussion stage in which Engineering Team 334 attempts to research and solve the EI 300 subject to the satisfaction of an RB 400. The very nature of this stage 508 precludes a fixed timeline or representation, but the system supports a real-time, dynamic timeline, representation, and interactive and iterative engineering approach involving enterprise discussions involving the EI engineering staff 334, presentations and discussion in all applicable RBs 400, drafting of R&Rs 414 and AIs 302, and finally closing out of the AIs 302 to close the opened EI 300. It is during this stage 508 that any RBs 400 are held, the RBs 400 assign Action Items 302 (AI=open status) for the opened EI 300, and the RBs 400 draft and/or distribute Recommendations and Rationales 414. According to an aspect of the embodiments, the R&Rs 414 by the RB 400 could influence the EI resolution 320 and/or disposition 322. According to an aspect of the embodiments, an EI 300 can have multiple RBs 400 and ERBIS tracks the same based upon the defined database entities (FIG. 2B). Therefore, ERBIS can support the case of having two different topics being discussed that relate to one engineering item 300 at two different boards 400 (assign review boards 400 to different areas of the problem if its necessary) by, for example, having multiple review boards assigned to a single EI 300 or spawning additional EIs 300. And for closure purposes, each of those review boards 400 have to convene and decide that the problem has been solved before closure of the EI (i.e., to close an engineering item, all boards that have met that are discussing the item have to have been closed or the boards have to agree with each other concerning the applicable closure requirements (e.g., description, resolution, disposition, etc.) for the engineering item). Related EIs can be cross-referenced as related. According to an aspect of the embodiments, an action item 302 may in turn spawn another engineering item 300 and ERBIS can track the same base upon the defined database entities (FIG. 2B). According to an aspect of the embodiments, ERBIS searchably documents the review process 508.

More particularly, during this stage 508 as a review process, the RB Coordinator 404 is charged with making sure that RB 400 meetings take place, including any required reconvenes, that data (e.g., investigation, resolution, disposition, etc. in connection with reaching closure of the EI 300) is presented for RB 400 consideration, managing status of AIs 302, such as progress according to schedule, open and/or closed, and that the board's recommendations are disseminated to the Engineering Team 334. According to an aspect of the embodiments, ERBIS actively manages the herein described review process 508, including supporting the RB Coordinator 404 role, for example, by managing (e.g., tracking/maintaining) any meeting schedules, including automatic notifications to users 210, managing AI 302 progress schedule, managing workflow, etc. ERBIS can support such interactive and iterative engineering approach regarding the investigatory side (e.g., Engineering Team 334) as well as the quality assurance (e.g., RB 400) side. When the RB Coordinating Engineer 404 assigns an RB 400, ERBIS automatically tracks which personnel 210 are assigned to which role 212 and sends a notification to the affected parties, for example, via email or other known methods. The same person can hold the role of RB Coordinator 404 and the EI Coordinating Engineer 304, and the converse is not precluded by ERBIS. According to the embodiments, operation 508 can be implemented to support physical in-person meetings and/or computer supported meetings, such as (without limitation) video, telephone, network meetings, etc., or any combinations thereof.

Figure 8A:
Figure 8B:
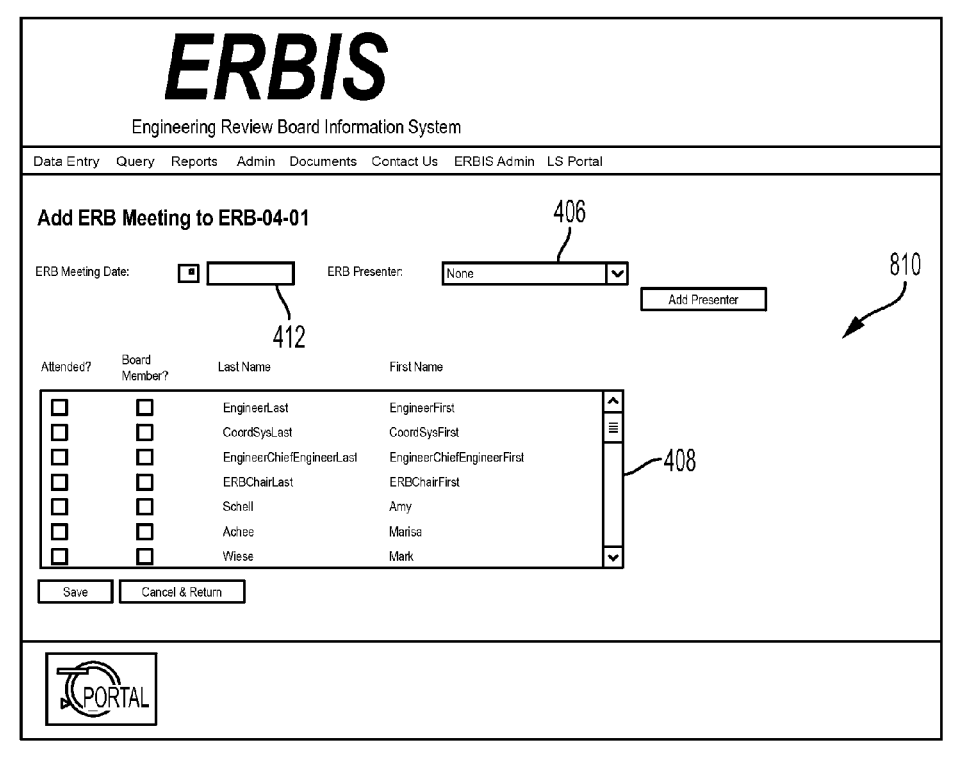
Figure 8C:
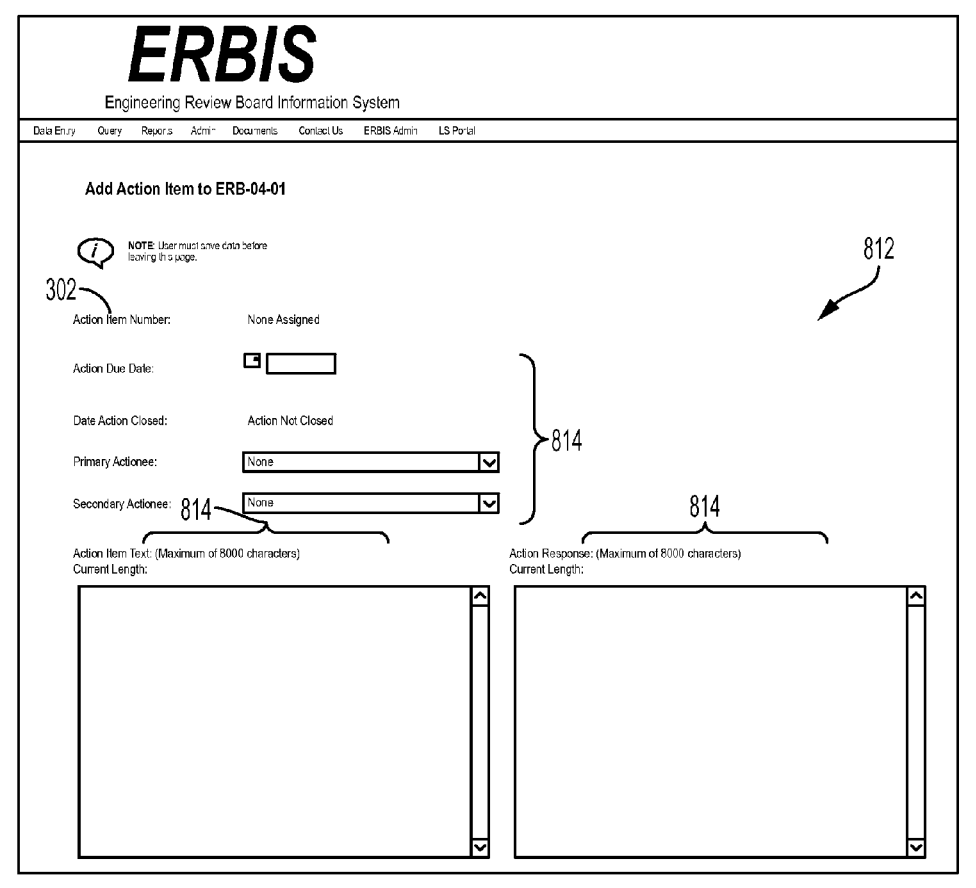
Figure 8D:

FIGS. 8A-8D are computer user interface display screen images to support a review board 400 meeting/discussion, according to an embodiment of the present invention. FIG. 8A shows the computer screen 800 that the user 210 with the role 212 of RB Coordinator 404 sees when setting up and maintaining the information associated with an RB 400. In FIG. 8A, the RB Coordinator 404 can pick the Chair 402 and the Coordinator (i.e., select himself/herself for the record or pass on the duties to another) as well as call an RB 400 meeting, generate Action Items 302, or enter Recommendations and Rationales 414. Should an RB 400 meeting be required, the RB Coordinator 404 can use the screen 810 shown in FIG. 8B to select the attendees and board members. If the RB Coordinator 404 wants to assign an Action Item 302, then he/she would see the screen shown in FIG. 8C. In FIG. 8C, the computer graphical user interface 812 allows the RB Coordinator 404 to manage an action item 302 (see Table 3) via the computer input interface 814 by choosing the due date, the actionees who are assigned, enter a description of the action item 302, enter a description of the action item response, or any combinations thereof. Likewise in FIG. 8D computer graphical user interface 816, the Coordinator can enter Recommendations and Rationales 414 drafted by the RB 400.

According to an aspect of the embodiments, an RB 400 may not be called or required. For example, the Engineering Team 334 can propose an EI Description 316, EI Resolution 320, and Disposition 322. If the Engineering Team 334, which includes a final reviewer and/or approver, such as the Chief Engineer 332, reaches consensus, the Initiating, Cognizant, and System Engineers can "sign" off the EI 300 and the Chief Engineer 332 closes the EI 300 according to operation 512. In particular, for example, for repeat problems with known solutions there might not be a need to go to an RB. According to application design, if a part is scraped, a test correctly rerun, or the proper inputs supplied to a software functional or performance test produces valid results, then there might not be a need for an RB 400. According to an aspect of the embodiments, such known solutions can be identified by cross-referencing the EI 300 knowledge base 104.

In FIG. 5, at operation 510, the Chief Engineer 332 can review the status of the AIs 302 and R&Rs 414 and approve their closure and subsequently close the associated RBs 400. The final outcome of this stage 510, is the completion of all AIs 302, and the agreement between the RBs 400 and the Engineering Team 334 assigned to the EI 300 on the Description 316, Resolution 320 and Disposition 322 of the opened EI 300. ERBIS tracks the approval process for an outstanding EI 300 as consensus is reached by the Engineering Team 334, which includes the Chief Engineer 332 final review and approval, concerning the EI 300 Description 316, the Resolution 320, the Disposition 322, and the response of the Engineering Team 334 to the AIs 302 and R&Rs 414. ERBIS also tracks the approval process of the RB 400, including the Engineering Team 334 seeking concurrence of the RB 400 concerning the opened EI 300. For example, at operation 512, the signature of the chief engineer 332 of an EI 300 is obtained and the EI 300 is closed, locked and archived for the knowledge base 104. Therefore, according to an aspect of the embodiments, closure of an EI 300 requires agreement of at least one engineer with final review/approval authority of the content of an EI 300 (e.g., a single Chief Engineer 332 as the Engineering Team 334 to review and approve the EI 300 content) and an RB 400. According to an aspect of the embodiments, any RB 400 should comprise of the Chief Engineer and at least one other user 210, as a subject matter expert who will present relevant information pertaining to the EI 300 under review. More particularly, ERBIS supports an EI 300 investigative side, such as the Engineering Team 334, and a quality of assurance side, such as an RB 400, to manage (e.g., solve) an identified engineering issue. Preferably the quality of assurance side comprises a member of the engineering team, such as the Chief Engineer 332, and another member independent of the investigative side. ERBIS disciplines the engineering review process by computer supporting closure of an EI 300 based upon required approval (sign off) of both the investigative side and the quality assurance side, based upon the defined database of disciplinal engineering review process entities. According to an aspect of the embodiments, the coordinator role(s) are generally one of a delegatee of the Chief Engineer 332 and/or the RB 400, since the Chief Engineer and the RB have respective final review/approval and oversight decision-making powers/authorities. For example, the EI Coordinator 304 can be charged with the administrative details, which require the authority of the Chief Engineer 300, to process an EI 300 until closure, but which are either too numerous or burdensome to be carried out directly by the same.

Figure 9:
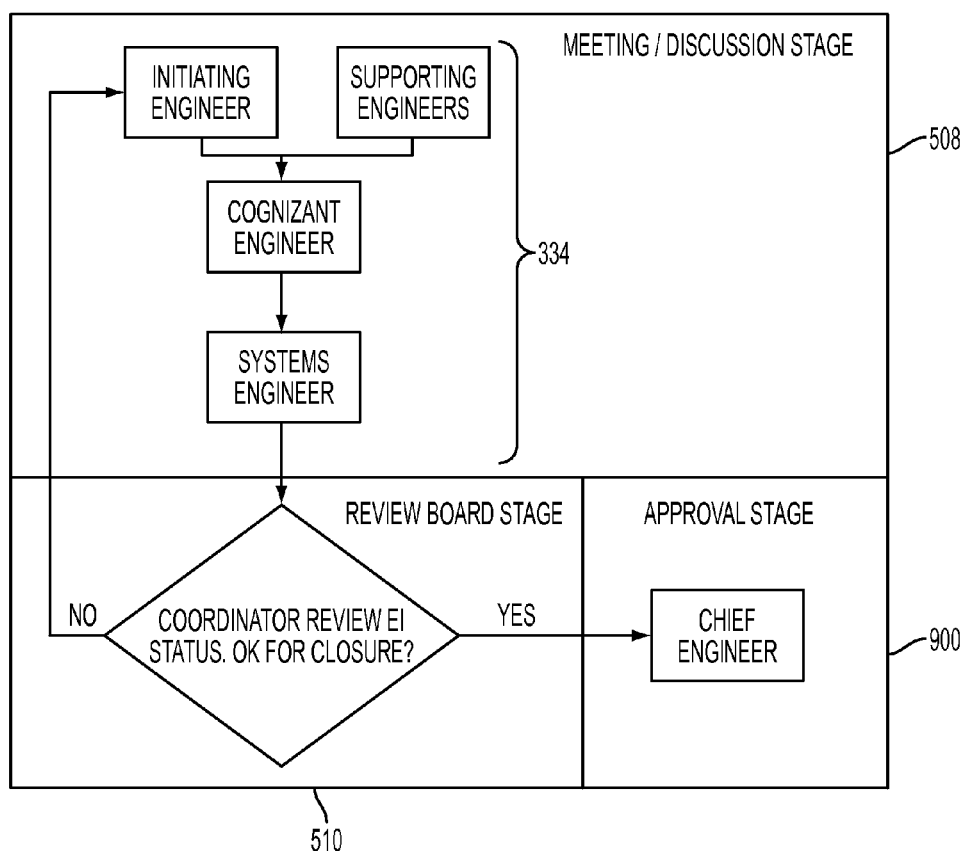
FIG. 9 is a flow chart of an opened engineering item closure process, according to an embodiment of the present invention.

FIG. 9 is a flow chart of an opened engineering item closure process, according to an embodiment of the present invention. In particular, FIG. 9 is a closure flow process of an example signature cycle for an opened EI 300. As indicated in FIG. 9, when agreement is reached during the meeting/discussion stage 508 within the Engineering Team 334 of an EI 300, each engineer identifies acceptance of the closure process by, for example, electronically initializing the EI 300. At operations 510 and 512, EI Coordinating Engineer 304 and/or the RB Coordinator 404 with direction from the Chief Engineer 332 of the EI 300 reviews EI status to determine if the EI can be closed and closes all open RBs 400, AIs 302, and R&Rs 414 in ERBIS and ensures that the Initiating, Cognizant, and Systems Engineers have all signed-off to the Description 316, Resolution 320, and Disposition 322 of the EI 300. According to an aspect of the embodiments, at operation 900, the EI Chief Engineer 332, such as a PMO chief engineer 332, finally signs-off the EI 300.

Figure 10:
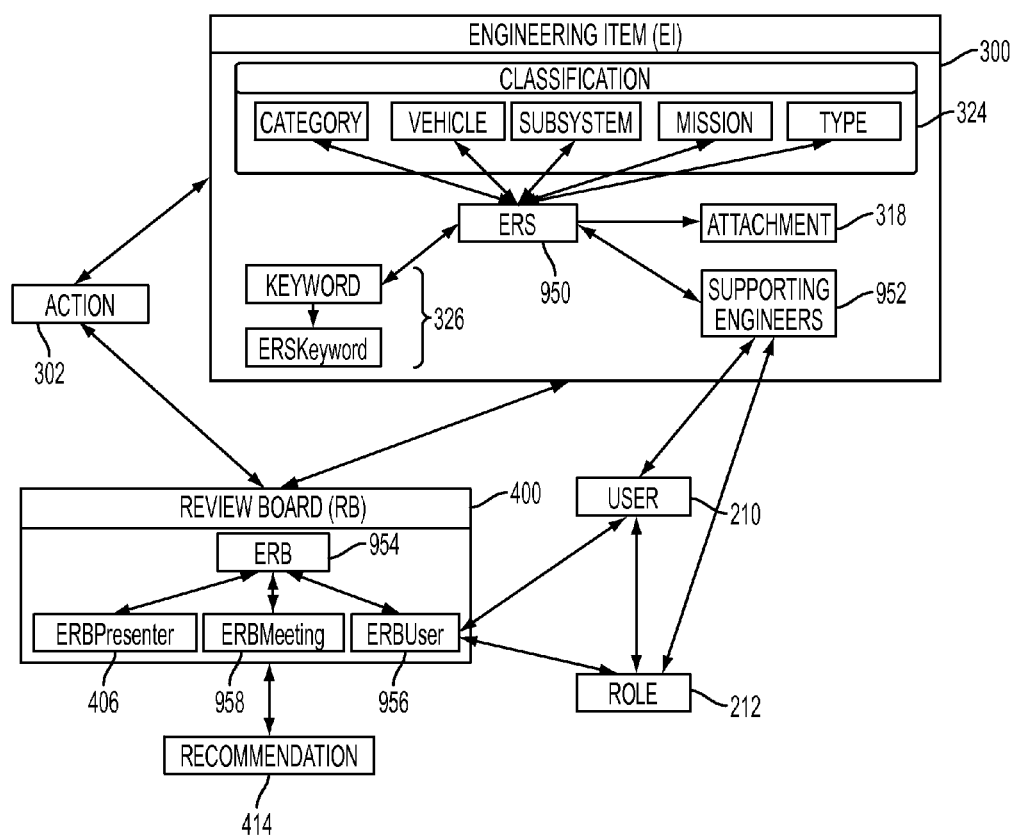
FIG. 10 is an example database entity relationship diagram for an Example Launch Vehicle enterprise program, according to an embodiment of the present invention.

FIG. 10 is an example database entity relationship diagram for an Example Launch Vehicle enterprise program, according to an embodiment of the present invention. In FIG. 10, the 'ERS' 950 contains all of the descriptive information 316 shown in FIG. 3 except for the Classification 324 and the Keyword 326 data. FIG. 10 shows the 'Supporting Engineers' 952 within the EI 300 entity, which can contains all the information related to Coordinating Engineer 304, Initiating Engineer 308, Cognizant Engineer 328, Systems Engineer 330, Chief Engineer 332, and other Supporting Engineers 312 as shown in FIG. 3. Thus, in FIG. 10, an engineering system issue is described as the ERS 950 and further disciplinarily defined based upon the classifications 324 and/or the keywords 326 (see FIG. 7A). The engineering system issue description is disciplined, because the classifications 324 and/or keywords 326 are established according to enterprise program policy(ies). The supporting engineers 952 support observation, investigation, and/or resolution of the engineering system issue 950. Further, the engineering system issue 952 is evidenced, for example, via computer readable data attachment(s) 318.

In FIG. 10, the 'ERB' 954 contains the Topic 410 and Title and Number information 420 shown in FIG. 4. The 'ERBUser' 956 within the RB 400 contains the data for Chairman 402, RB Coordinator 404, and Attendees 408 shown in FIG. 4. The 'ERBMeeting' 958 contains the rest of the descriptive data 412 shown in FIG. 4. Thus, in FIG. 10, a topic 956, which an EI 300, AIs 302 and/or R&Rs 414, are presented to a review board 400 and reviewed in meetings/discussions 958 by board members 954.

Figure 11:
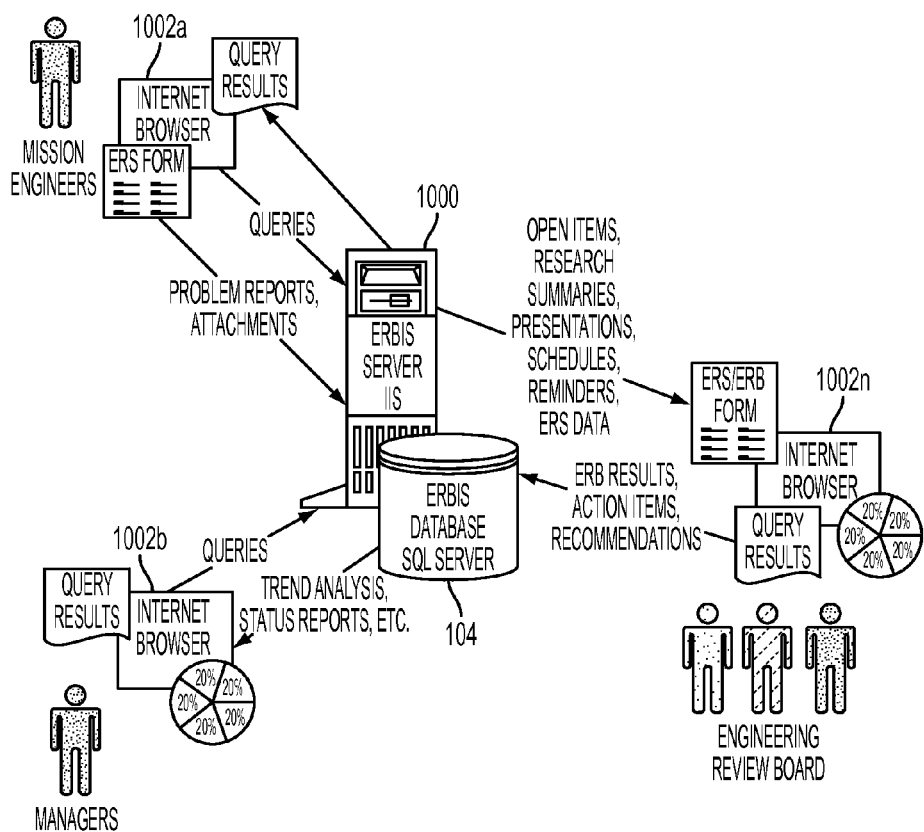
FIG. 11 is a functional block diagram of an engineering review process computer system, according to an embodiment of the present invention.

FIG. 11 is a functional block diagram of an engineering review process computer system, according to an embodiment of the present invention. In FIG. 11, an Engineering Review Board Information System (ERBIS) can be implemented in software and/or computer hardware controlling networked computers, for example, as servers and/or clients in case of a client-server network architecture. A computer readable media, including a computer data signal embodied in a carrier wave, provide an engineering system issue review service via a software program to control one or more computers according to the herein described processes of embodiments. The embodiments provide methods, apparatuses (computer systems) and/or computer readable media for engineering system issue review services. In FIG. 11 the server 1000 can be any computer serving information to the clients 1002*a-n* via wire or wirelessly according to known techniques. In FIG. 10, the clients 1002*a-n* can be any computer to have a client function, including (without limitation) personal computers, wire and/or wireless personal digital assistants (PDAs), wire and/or wireless telephones, laptops, etc. In FIG. 11, the ERBIS server 1000 stores the ERBIS software and/or hardware, including the knowledge base database 104, to control the server according to the described embodiment processes of the present invention. According to an aspect of the embodiments, clients 1002*a-n* execute Internet based browser software for users 210 to access the ERBIS software on the server 1000 to perform the engineering review process according to the present invention. For example, (1) engineers 210 can open EIs 300 to report problems, including evidence attachments, (2) user engineers 210 and managers 210 can query the ERBIS knowledge base database 104 for trend analysis and status reports, and (3) the ERB 400 can review opened EIs 300, submit or give action items 302, give R&R 414, for example, in form of research summaries, presentations, and receive schedule information, reminders, and other EI data. The embodiments provide, based upon vocabulary and/or environment of possible trackable engineering system issues at an enterprise program level, a disciplined or structured computer displayed graphical user interface to an engineering system issue review process. The knowledge base database 104 can be implemented using any Structured Query Language (SQL) based relational database. According to an aspect of the embodiments, ERBIS is implemented to be a web-based (browser software based) application so that a very large community can enter data as well as extract data. However, the application could be implemented to function as an operating system based (e.g., MICROSOFT WINDOWS based, etc.) application.

Figures 12A, 12B:
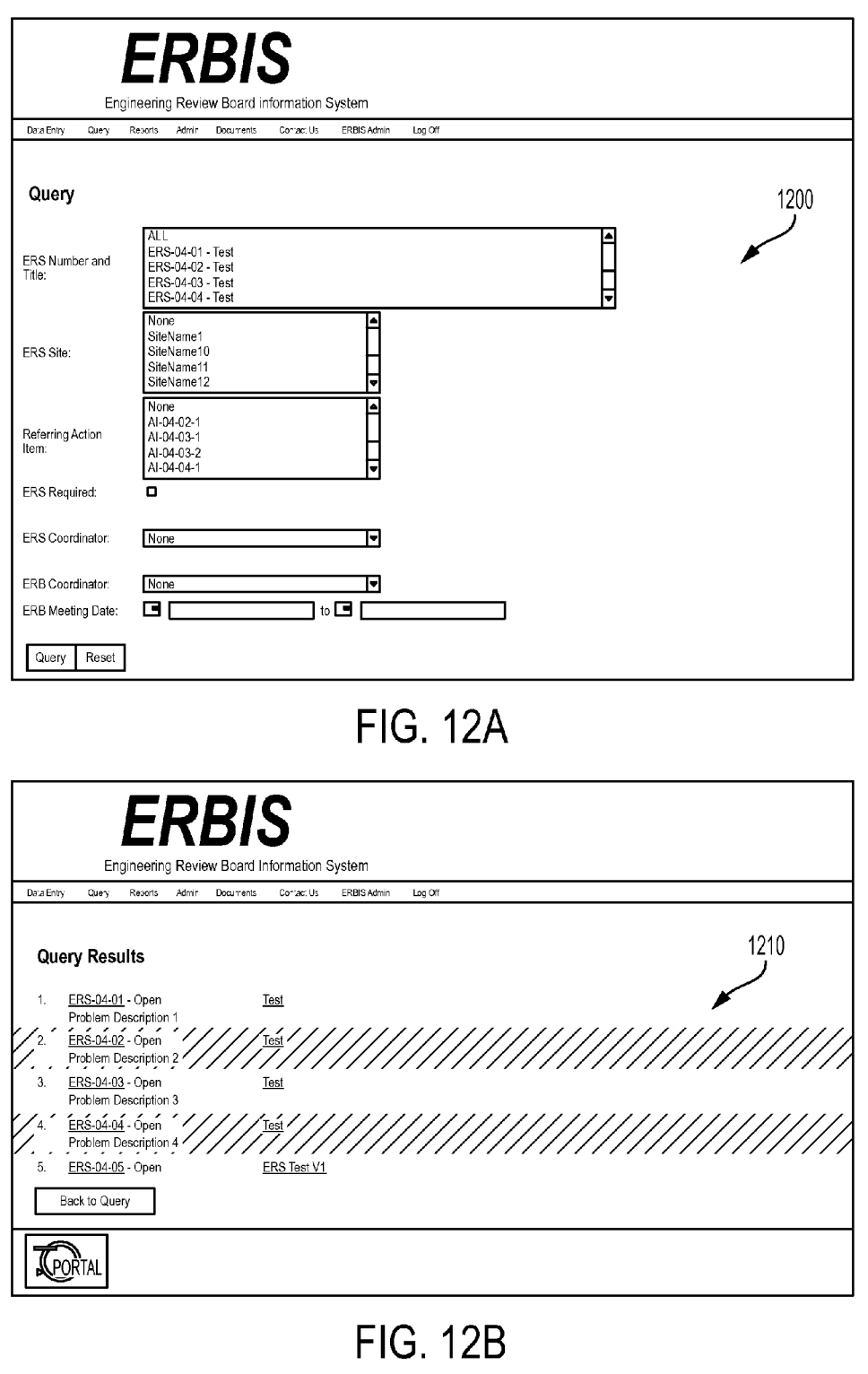

FIGS. 12A-12C are computer user interface display screen images to query the engineering review process knowledge base, according to an embodiment of the present invention. FIGS. 12A-12C show the screens that a user 210, for example, a member of the program management office (PMO) would see when reviewing all EIs 300 at an enterprise programmatic level. FIG. 12A shows a high-level summary computer graphical user interface screen 1200 of all the EIs 300 in ERBIS. By selecting the Query button, the PMO representative can then see all the EIs 300 associated with a given search criteria based upon the disciplinal engineering review process database entities, including attributes thereof, such as (without limitation), classification 324 and/or keywords 326. FIG. 12B is a computer graphical user interface screen 1210 of the results of an example search of the knowledge base database 104. Lastly, a member of the program management office (PMO) can get a summary of the information related to a specific ERS 300 by selecting, for example, an ERS number. FIG. 12C is a computer graphical user interface screen 1220 of an EI 300 summary. Therefore, according to the embodiments, ERBIS focuses on the problem at hand via the EI 300 and how the EI 300 has been resolved. ERBIS allows retrieving a closure history of the EI 300, including the EI's assigned RBs 400 and the RBs' actions. For example, all review boards that an engineering issue has been assigned are actually tracked within the engineering issue itself, which can be accessed.

The present invention has been described to provide a method and computer system to enforce disciplinal resolution of observed engineering system issues in an enterprise program and to provide a knowledge base of such engineering system issues. A method and computer system, comprising defining disciplinal engineering review process database entities for an enterprise engineering program including one or more engineering systems; opening a computer supported engineering system issue based upon the defined disciplinal engineering review process entities; managing a review of the opened engineering system issue according to the defined disciplinal engineering review process entities; and closing the opened engineering system issue according to the opened engineering system issue review. The disciplinal engineering review process database entities comprise an engineering item to disciplinarily describe the engineering system issue, including evidence of the engineering system issue, one or more users and assignable roles to the users for investigation of the engineering system issue described in the engineering item, a review board to manage the investigation of the engineering system issue described in the engineering item, action items by the review board in connection with the investigation of the engineering system issue, and engineering system issue recommendation and rationale by the review board. The classification and/or keyword define the vocabulary and environment of possible engineering system issues to be tracked at the enterprise program level to support queries, metrics of trending or pattern analysis, historical reports, status reports, risk evaluation, issue resolution and/or disposition, or any combinations thereof. The system can be used to track engineering system issues by any level group other than at the enterprise program level. However, the system can be more beneficial for higher group levels, because more people can contribute and share the data. According to the above example described embodiments, ERBIS is used for a completed system (such as an existing or completed launch vehicle), but the engineering design effort that goes into any substantial development process or manufacturing process can be addressed by ERBIS. From a hydraulic pump on a rocket to the design of a brake on an automobile. In other words, ERBIS can be used for during a development phase of an engineering system.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention. Thus, although a few preferred embodiments of the present invention have been shown and described, it would be appreciated by those skilled in the art that changes may be made in the embodiments without departing from the principles and spirit of the invention, the scope of which is defined in the claims and their equivalents.

What is claimed is:

1. A method for a computer system to implement at least two databases of input data for investigation and reviewing the investigation of an engineering system problem, the method comprising:

executing, by computer hardware including a programmed computer processor, a process to:

store, in a non-transitory computer readable medium, database entities that define, for an enterprise engineering program, an engineering system problem in a plurality of engineering systems of the enterprise engineering program, a first database entity of investigative data including a plurality of engineering items, an engineering item configured to:

specify an engineering system problem, which is as a result of an inspection, a test, and/or a review of a thing, hardware-component and/or software-component for an engineering system of the enterprise engineering program and identified with a discrepancy from and/or observation in behavior of a specified requirement, based upon a plurality of attributes trackable at the enterprise engineering program level across the plurality of engineering items and the plurality of engineering systems, the trackable attributes including classifications and keywords defined according to a vocabulary and an environment of engineering system problems at the enterprise engineering program level across the plurality of engineering items and the plurality of engineering systems, to thereby standardize storage of the engineering system problem at the enterprise engineering program level across the plurality of engineering items and the plurality of engineering systems so that categorization of the plurality of engineering items occurs at the enterprise engineering program level across the plurality of engineering items and the plurality of engineering systems, specify one or more locatable computer readable data as evidence description information, or physical evidence location information, or any combinations thereof, specify an engineering team of one or more users and assignable roles to the users for input data of investigation of the engineering system problem described in the engineering item, and specify an action item in support of investigation of the engineering system problem; and a second database entity of quality assurance data including a review board item configured to specify status of the review, a review board including a user and a role of the user for input data of review of the engineering item, and recommendations and rationales for closure of the engineering item, the first and second database entities of investigative data and quality assurance data related in at least a one-to-many relationship of one investigative data to a plurality of quality assurance data through the engineering item of the first database of the investigative data;

receive:

input data for the engineering item, including input data for the trackable attributes including classifications and keywords defined according to the vocabulary and the environment of the engineering system problem at the enterprise engineering program level, the evidence, the engineering team, the action item, and input data for at least two review board items;

categorize the engineering item at the enterprise engineering program level across the plurality of engineering items and the plurality of engineering systems, according to the input data for the trackable attributes including classifications and keywords defined according to the vocabulary and the environment of engineering system problems at the enterprise engineering program level across the plurality of engineering items and the plurality of engineering systems,
  to thereby indicate an open engineering item, assignment of the at least two review board items to the opened engineering item and a relationship in the at least one-to-many relationship of the input data of the first database entity of investigative data of the engineering item to the input data of the second database entity of quality assurance data of the at least two review board items; and
cross-reference, according to the input data of the classifications and keywords for the opened engineering item and the categorization of a plurality of other engineering items of the first database of investigative data, the first and second database entities of investigative data and quality assurance data related in the at least one-to-many relationship, to output a search result,
  to thereby support the closure of the opened engineering item through the assigned review board items according to the search result of the cross-reference.

2. The method of claim 1, wherein the engineering item further includes a resolution, a disposition, identification of a user from among the engineering team having a lead investigative authority role for the engineering item.

3. The method of claim 1, wherein to receive the input data, an iterative engineering approach is supported involving discussions by the engineering item engineering team, presentations and discussions to the review board, drafting of the recommendations and rationales by the review board, assignment of action items to the engineering item engineering team by the review board, and closing outstanding action items for the closure of the opened engineering item.

4. The method of claim 3, wherein to receive the input data of the review board item, the process:
  assigns, to the opened engineering item, the engineering team including at least one engineer having a lead investigative authority role, and
  assigns, to the at least two review board items, respective engineers having a review approval authority role for the closure of the opened engineering item.

5. The method of claim 1, wherein the classification and/or the keyword is real-time, dynamically assigned based upon an established terminology at the enterprise engineering program level.

6. The method of claim 1, wherein to receive the input data for the at least two review board items an iterative and interactive engineering approach is supported to obtain an agreement between the investigatory side and the quality assurance side for the closure of the engineering item.

7. The method of claim 1, wherein the executing of the process further comprises to generate a computer displayed graphical user interface displaying the engineering item including the engineering system problem, the evidence, the engineering team, the action item, and the review board item including the recommendations and rationale of the review board.

8. An apparatus configured to implement at least two databases of input data for investigation and reviewing the investigation of an engineering system problem, the apparatus comprising:
  a computer processor programmed to:
    store, in a non-transitory computer readable medium, database entities that define for an enterprise engineering program, an engineering system problem in a plurality of engineering systems of the enterprise engineering program,
      a first database entity of investigative data including a plurality of engineering items, an engineering item configured to:
        specify an engineering system problem, which is as a result of an inspection, a test, and/or a review of a thing, hardware-component and/or software-component for an engineering system of the enterprise engineering program and identified with a discrepancy from and/or observation in behavior of a specified requirement,
          based upon a plurality of attributes trackable at the enterprise engineering program level across the plurality of engineering items and the plurality of engineering systems, the trackable attributes including classifications and keywords defined according to a vocabulary and an environment of engineering system problems at the enterprise engineering program level across the plurality of engineering items and the plurality of engineering systems,
          to thereby standardize storage of the engineering system problem at the enterprise engineering program level across the plurality of engineering items and the plurality of engineering systems so that categorization of the plurality of engineering items occurs at the enterprise engineering program level across the plurality of engineering items and the plurality of engineering systems,
        specify one or more locatable computer readable data as evidence description information, or physical evidence location information, or any combinations thereof,
        specify an engineering team of one or more users and assignable roles to the users for input data of investigation of the engineering system problem described in the engineering item, and
        specify an action item in support of investigation of the engineering system problem; and
      a second database entity of quality assurance data including a review board item configured to specify status of a review, a review board including a user and a role of the user for input data of review of the engineering item, and recommendations and rationales for closure of the engineering item,
    the first and second database entities of investigative data and quality assurance data related in at least a one-to-many relationship of one investigative data to a plurality of quality assurance data through the engineering item of the first database of the investigative data;
    receive:
      input data for the engineering item, including input data for the trackable attributes including classifications and keywords defined according to the vocabulary and the environment of the engineering system problem at the enterprise engineering program level, the evidence, the engineering team, the action item, and
      input data for at least two review board items;
    categorize the engineering item at the enterprise engineering program level across the plurality of engineering items and the plurality of engineering systems, according to the input data for the trackable attributes including classifications and keywords defined according to the vocabulary and the environment of engineering system problems at the enterprise engineering program level across the plurality of engineering items and the plurality of engineering systems, to thereby indicate an open engineering item, assignment of the at least two review board items to the opened engineering item and a relationship in the at least one-to-many relationship of the input data of the first database entity of the investigative data of the engineering item to the input data of the second database entity of quality assurance data of the at least two review board items, and cross-reference, according to the input data of the classifications and keywords for the opened engineering item and the categorization of a plurality of other engineering items of the first database of investigative data, the first and second database entities of investigative data and quality assurance data related in the at least one-to-many relationship, to output a search result, to thereby support the closure of the opened engineering item through the assigned review board items according to the search result of the cross-reference.

9. The apparatus according to claim 8, wherein the engineering item further includes a resolution, a disposition, identification of a user from among the engineering team having a lead investigative authority role for the engineering item.

10. The apparatus according to claim 8, wherein to receive the input data, an iterative engineering approach is supported involving discussions by the engineering item engineering team, presentations and discussions to the review board, drafting of the recommendations and rationales by the review board, assignment of action items to the engineering item engineering team by the review board, and closing outstanding action items for the closure of the opened engineering item, and wherein to receive the input data of the review board item, the engineering team including at least one engineer having a lead investigative authority role is assigned to the opened engineering item, and respective engineers having a review approval authority role for the closure of the opened engineering item are assigned to the at least two review board items.

11. A computer system to implement at least two databases of input data for investigation and reviewing the investigation of an engineering system problem, the computer system comprising:

a client computer; and a server computer communicationally coupled to the client computer and configured to execute:

store, in a non-transitory computer readable medium, database entities that define for an enterprise engineering program an engineering system problem in a plurality of engineering systems of the enterprise engineering program, a first database entity of investigative data including a plurality of engineering items, an engineering item configured to:

specify an engineering system problem, which is as a result of an inspection, a test, and/or a review of a thing, hardware-component and/or software-component for an engineering system of the enterprise engineering program and identified with a discrepancy from and/or observation in behavior of a specified requirement, based upon a plurality of attributes trackable at the enterprise engineering program level across the plurality of engineering items and the plurality of engineering systems, the trackable attributes including classifications and keywords defined according to a vocabulary and an environment of engineering system problems at the enterprise engineering program level across the plurality of engineering items and the plurality of engineering systems, to thereby standardize storage of the engineering system problem at the enterprise engineering program level across the plurality of engineering items and the plurality of engineering systems so that categorization of the plurality of engineering items occurs at the enterprise engineering program level across the plurality of engineering items and the plurality of engineering systems, specify one or more locatable computer readable data as evidence description information, or physical evidence location information, or any combinations thereof, specify an engineering team of one or more users and assignable roles to the users for input data of investigation of the engineering system problem described in the engineering item, and specify an action item in support of investigation of the engineering system problem; and a second database entity of quality assurance data including a review board item configured to specify status of the review, a review board including a user and a role of the user for input data of review of the engineering item, and recommendations and rationales for closure of the engineering item, the first and second database entities of investigative data and quality assurance data related in at least a one-to-many relationship of one investigative data to a plurality of quality assurance data through the engineering item of the first database of the investigative data;

receive from the client computer:

input data for the engineering item, including input data for the trackable attributes including classifications and keywords defined according to the vocabulary and the environment of the engineering system problem at the enterprise engineering program level, the evidence, the engineering team, the action item, and input data for at least two review board items;

categorize the engineering item at the enterprise engineering program level across the plurality of engineering items and the plurality of engineering systems, according to the input data for the trackable attributes including classifications and keywords defined according to the vocabulary and the environment of engineering system problems at the enterprise engineering program level across the plurality of engineering items and the plurality of engineering systems, to thereby indicate an open engineering item, assignment of the at least two review board items to the opened engineering item and a relationship in the at least one-to-many relationship of the input data of the first database entity of investigative data of the engineering item to the input data of the second database entity of quality assurance data of the at least two review board items; and cross-reference, according to the input data of the classifications and keywords for the opened engineering item and the categorization of a plurality of other engineering items of the first database of investigative data, the first and second database entities of investigative data and quality assurance data related in the at least one-to-many relationship, to output a search result, to thereby support the closure of the opened engineering item through the assigned review board items according to the search result of the cross-reference.

* * * * *